US007294891B2

(12) United States Patent
Nonaka

(10) Patent No.: US 7,294,891 B2
(45) Date of Patent: Nov. 13, 2007

(54) SEMICONDUCTOR INTEGRATED CIRCUIT HAVING TRANSISTORS FORMED ON AN INSULATING SUBSTRATE

(75) Inventor: Yoshihiro Nonaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/648,256

(22) Filed: Aug. 27, 2003

(65) Prior Publication Data
US 2004/0049755 A1    Mar. 11, 2004

(30) Foreign Application Priority Data
Sep. 11, 2002    (JP)    ............................. 2002-265067

(51) Int. Cl.
*H01L 29/76*    (2006.01)
(52) U.S. Cl. ........................... 257/401; 257/59; 257/72
(58) Field of Classification Search .................. 257/59, 257/72, 231, 401
See application file for complete search history.

(56) References Cited

U.S. PATENT DOCUMENTS 5,270,657 A * 12/1993 Wirth et al. ................. 324/322
5,777,369 A *  7/1998 Lin et al. ..................... 257/368
6,177,691 B1 *  1/2001 Iranmanesh et al. ........ 257/211
6,707,139 B2 *  3/2004 Fujii et al. ................... 257/678
6,995,516 B2 *  2/2006 Aoki et al. ............... 315/169.3

FOREIGN PATENT DOCUMENTS

| CN | 1239355 A | 12/1999 |
|---|---|---|
| JP | 9-15637 | 1/1997 |
| JP | 10-133232 | 5/1998 |

* cited by examiner

*Primary Examiner*—Ori Nadav
(74) *Attorney, Agent, or Firm*—Young & Thompson

(57) ABSTRACT

A layout capable of placing a circuit constituted by a plurality of transistors in a small-with region is automatically formed. A search section inputs data on a circuit and makes a search for a set of routes formed so that passage through any one of the transistors occurs only one time and so that the combination of routes in one set can cover the entire circuit network. An extraction section extracts a set of routes having the smallest number of routes in sets of route found by searching. A width determination section determines the layout width from the widths of source and drain electrodes of each transistor, the width of the region between the source and drain electrodes, the width of the region between some of the adjacent pairs of the transistors not combined into a common electrode, the number of transistors, and the smallest number of routes. A layout determination section forms information on a layout in which all the source, drain and gate electrodes of the transistor included in the circuit are placed in a small-width region having the determined width.

7 Claims, 26 Drawing Sheets

LAYOUT ACCORDING TO THIRD EMBODIMENT

LAYOUT ACCORDING TO FIRST EMBODIMENT

WIRING SWITCH CIRCUIT

LAYOUT ACCORDING TO SECOND EMBODIMENT

WIRING SWITCH CIRCUIT

LAYOUT ACCORDING TO THIRD
EMBODIMENT

LAYOUT ACCORDING TO THIRD
EMBODIMENT

LAYOUT ACCORDING TO FOURTH EMBODIMENT

EXAMPLE OF CIRCUIT LAYOUT OF DISPLAY OR SENSOR ACCORDING TO FIFTH EMBODIMENT

ENLARGED DIAGRAM OF CIRCUIT LAYOUT OF DISPLAY OR SENSOR

SILICON POLYCRYSTALLIZATION FOR THIN-FILM
TRANSISTOR CIRCUIT

GATE ELECTRODE FORMING STEP FOR
THIN-FILM TRANSISTOR CIRCUIT

ALGORITHM FOR AUTOMATIC LAYOUT FORMATION

SYSTEM BLOCK DIAGRAM OF AUTOMATIC LAYOUT FORMATION

CHARGE-PUMP-TYPE VOLTAGE BOOSTING CIRCUIT

TWO-DIMENSIONAL CIRCUIT NETWORK MAP, CONNECTED NODE ARRAY, AND CONNECTED TREE ARRAY

EXTERNALLY CONNECTED NODE ARRAY

EXAMPLE OF DATA ON "SET OF ROUTES"

AUTOMATIC CONNECTION
(ALL NODE SEARCH FLOWCHART)

FIG. 22

Nmin = 2

| tbl | 1 | 2 |
|-----|---|---|
| 1   | 1 | 2 |
| 2   | 2 | 1 |

Nmin = 3

| tbl | 1 | 2 | 3 |
|-----|---|---|---|
| 1   | 1 | 2 | 3 |
| 2   | 1 | 3 | 2 |
| 3   | 2 | 1 | 3 |
| 4   | 2 | 3 | 1 |
| 5   | 3 | 1 | 2 |
| 6   | 3 | 2 | 1 |

EXAMPLE OF PERMUTATION DATA tbl

FLOWCHART OF MUTUAL CONNECTION

FLOWCHART OF Cbuf MUTUAL CONNECTION

FIG. 26

Cbuf (1) | Cbuf (2)

| a F g H h | d G f E e D c B a A b C d I i K e L j J k |

Rbuf

| a F g H h / d G f E e D c B a A b C d I i K e L j J k |
| a F g H h / k J j L e K i I d C b A a B c D e E f G d |
| h H g F a / d G f E e D c B a A b C d I i K e L j J k |
| h H g F a / k J j L e K i I d C b A a B c D e E f G d |

| d G f E e D c B a A b C d I i K e L j J k / a F g H h |
| d G f E e D c B a A b C d I i K e L j J k / h H g F a |
| k J j L e K i I d C b A a B c D e E f G d / a F g H h |
| k J j L e K i I d C b A a B c D e E f G d / h H g F a |

EXAMPLE OF CONCATENATED ROUTES ( Nmin = 2 )

FLOWCHART OF MUTUAL CONNECTION OF Rbuf AND COMPUTATION OF TOTAL LENGTH

FIG. 28

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | SUM |
|---|---|---|---|---|---|---|---|---|---|---|---|---|---|---|---|---|---|---|---|---|---|---|---|---|---|---|---|---|
| Rbuf | a | F | g | H | h | / | d | G | f | E | e | D | c | B | a | A | b | C | d | B | i | K | e | L | j | J | k | |
| M() | 14 | | | | | | 12 | | | 12 | | | | | | | | | | | | | | | | | | 38 |
| Rbuf | a | F | g | H | h | / | d | G | f | E | e | D | c | B | a | A | b | C | d | a | a | D | e | E | f | G | d | |
| M() | 18 | | | | | | 12 | | | 12 | | | | | | | | | | | | | | | | | | 42 |
| Rbuf | h | H | g | F | a | / | k | J | j | L | e | K | i | I | d | C | b | A | a | B | c | K | e | L | j | J | k | |
| M() | | | | | | | 12 | | | 12 | | | | | | | | | | | | | | | | | | 34 |
| Rbuf | h | H | g | F | a | / | k | J | j | L | e | K | i | I | d | C | b | A | a | B | c | D | e | E | f | G | d | |
| M() | | | | | | | 12 | | | 12 | | | | | | | | | | | | | | | | | | 38 |
| Rbuf | d | G | f | E | e | D | c | B | a | A | b | C | d | I | i | K | e | L | j | J | k | / | a | F | g | H | h | |
| M() | 12 | | | | | | | | 14 | | | | | | | | | | | | | | | | | | | 38 |
| Rbuf | d | G | f | E | e | D | c | B | a | A | b | C | d | I | i | K | e | L | j | J | k | / | h | H | g | F | a | |
| M() | 12 | | | | | | | | 18 | | | | 12 | | | | | | | | | | | | | | | 42 |
| Rbuf | k | J | j | L | e | K | i | I | d | C | b | A | a | B | c | D | e | E | f | G | d | / | a | F | g | H | h | |
| M() | 12 | | | | | | | | 12 | | | | 10 | | | | | | | | | | | | | | | 34 |
| Rbuf | k | J | j | L | e | K | i | I | d | C | b | A | a | B | c | D | e | E | f | G | d | / | h | H | g | F | a | |
| M() | 12 | | | | | | | | 12 | | | | 14 | | | | | | | | | | | | | | | 38 |

Rbuf AND ARRAY M HAVING SMALLEST SUM ARE STORED IN Lbuf AND Mbuf

⟹

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | Lmin |
|---|---|---|---|---|---|---|---|---|---|---|---|---|---|---|---|---|---|---|---|---|---|---|---|---|---|---|---|---|
| Lbuf(1) | h | H | g | F | a | / | d | G | f | E | e | D | c | B | a | A | b | C | d | I | i | K | e | L | j | J | k | |
| Mbuf(1) | | | | | 10 | | | 12 | | | | | | | | | | | | | | | | | | | | 34 |
| Lbuf(2) | k | J | j | L | e | K | i | I | d | C | b | A | a | B | c | D | e | E | f | G | d | / | a | F | g | H | h | |
| Mbuf(2) | | | | | | | 12 | | | 12 | | | | | | | | | | | | | | | | | | 34 |

EXAMPLE OF CONCATENATED ROUTES Rbuf, MUTUAL CONNECTION DATA M AND TOTAL MUTUAL CONNECTION WIRING LENGTH

FLOWCHART OF PREPARATION OF EXTERNAL CONNECTION LINE DATA

FIG. 30

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | Nmin | Lmin |
|---|---|---|---|---|---|---|---|---|---|---|---|---|---|---|---|---|---|---|---|---|---|---|---|---|---|---|---|---|---|
| Lbuf(1) | h | H | g | F | a | A | b | C | d | / | a | B | c | D | e | E | f | G | d | l | i | K | e | L | j | J | k | 2 | |
| Mbuf(1) | | | | | 6 | | | | 10 | | | | | | 8 | | | | | | | | | | | | | | |
| Nbuf(1) | 1 | 0 | 1 | 0 | 0 | 0 | 1 | 0 | 0 | 0 | 1 | 0 | 1 | 0 | 0 | 0 | 1 | 0 | 1 | 0 | 1 | 0 | 1 | 0 | 1 | 0 | 1 | | 24 |
| Lbuf(2) | k | J | j | L | e | K | i | l | d | G | f | E | e | D | c | B | a | / | d | C | b | A | a | F | g | H | h | 2 | |
| Mbuf(2) | | | | | 8 | | | | 12 | | | | | | | | 6 | | | | | | | | | | | | |
| Nbuf(2) | 1 | 0 | 1 | 0 | 0 | 0 | 1 | 0 | 0 | 0 | 1 | 0 | 1 | 0 | 1 | 0 | 0 | 0 | 1 | 0 | 1 | 0 | 1 | 0 | 1 | 0 | 1 | | 24 |

RESULTS OF EXECUTION OF AUTOMATIC LAYOUT ALGORITHM

EXAMPLE OF AUTOMATIC LAYOUT

EXAMPLE OF ORDINARY LAYOUT

EXAMPLE OF ORDINARY LAYOUT

EXAMPLE OF ORDINARY LAYOUT

SEMICONDUCTOR INTEGRATED CIRCUIT HAVING TRANSISTORS FORMED ON AN INSULATING SUBSTRATE

BACKGROUND OF THE INVENTION

1. Field of the Invention

The present invention relates to a semiconductor integrated circuit having transistors formed on a semiconductor substrate, an insulation substrate or a glass substrate and, more particularly, to a semiconductor integrated circuit capable of being laid out in a small-width region and a circuit layout designing method enabling such layout.

2. Description of the Related Art

For display devices and sensors, a method has generally been used in which peripheral circuits for driving a group of transistors (active matrix) for controlling display elements or sensor elements are mounted around a display region or a sensing region or formed on the same substrate as that for the active matrix (see, for example, patent documents 1 and 2 shown below). To increase the display region or the sensing region, the peripheral circuit is placed in straight narrow regions around the display region or the sensing region. A small-width peripheral circuit layout is made in such narrow regions, thus making it possible to provide a narrow-frame display device or sensor having an increased display or sensing region. Signal lines and power supply lines from external are connected by a flexible printed circuit (FPC) or the like to the peripheral circuits from a frame portion of the device. Therefore the external connection terminals of the peripheral circuits are concentrated on one side and the degree of freedom of layout is low. On the other hand, there is a need to increase the width of power supply lines in comparison with that of other signal lines for the purpose of limiting a voltage drop and power consumption when large currents flow through the power supply lines by concentration of currents flowing through the circuits in the device.

FIG. 2 shows a circuit for switching between power supply lines as an example of a circuit including three or more power supply lines. FIG. 32 shows an example of a possible case of layout of this circuit in a small-width region. In the switching circuit, a power supply line a34 is selectively connected to a line A32 or a line B33 through a gate signal φ. Since the circuit is constituted by two transistors 10 and 11, gate electrodes 30 and 31 each having a gate length Lg and a gate width Wg are aligned in one direction to make a small-width layout. That is, the power supply lines A32 and B32 having a length Wg and a width W are placed by the side of the gate electrodes 30 and 31 longitudinally aligned and the power supply line a34 having a length 2Wg and a width W is placed so as to face the gate electrodes 30 and 31. The power supply lines are each formed by a first metal layer and are electrically connected to active regions in the bodies of the transistors 10 and 11 through contacts (not shown). The layout width in this layout is the sum of the width of one gate and the width of two power supply lines (Lg+2W), which is small. For ease of explanation, the spacing between the gate electrodes and the first metal layer electrodes is assumed to be zero. The layout area is roughly expressed as (Lg+2W)×2Wg.

FIG. 33 shows an example of an ordinary possible layout in a case where the power supply lines A32 and B33 are connected from an upper side of a layout to external points 50 and the power supply line a34 is wired in the layout. As wiring for internal connection, the power supply line a34 is extended downward as viewed in the figure so as not to increase the layout width. Similarly, as wiring for connection to external points, the power supply lines A32 and B33 are extended upward as viewed in the figure. However, the layout width is necessarily increased by an amount corresponding to the power supply line width W since the lines A32 and B33 are extended so as not to overlap each other. The layout area is thereby increased to (Lg +3W) ×2Wg.

FIG. 34 shows an example of an arrangement in which the gate 30 is formed in such a manner that it is divided into sections and the sections are placed parallel to each other. The layout area of the gate 30 is thereby reduced. If the area of the gate electrode is not reduced by the parallel placement, the length of the gate region 30 is expressed as (Lg×Wg)/(Lg+W) since the gate area Lg×Wg of the gate region 30 of the transistor 10 is equal to that of the transistor 11. The layout area not including the wiring extensions in the arrangement shown in FIG. 34 is the product of the width (Lg+3W) and the length (Wg+(Lg×Wg)/(Lg+W)), i.e., (Lg+ 3W)×Wg×(2Lg+W)/(Lg+W). This area is always smaller than the area shown in FIG. 33 if W>0. In this layout, however, a change in layout cannot be made easily because the optimum parallel gate placement varies from transistor to transistor if the complexity of the circuit is increased.

(Patent Document 1)
Japanese Patent No. 2697728

(Patent Document 2)
Japanese Patent Laid-Open No. 10-133232

Circuit layouts such as those shown in FIGS. 32 to 34 are ordinarily adopted as layouts for placement in a small-width region. In such circuit layouts, however, the layout area is increased or the transistor-to-transistor layout is complicated and a change in layout cannot be easily made. Moreover, in a case where external input/output terminals are concentrated on one side so that the degree of freedom of layout is low, the layout width is increased by extended wiring.

SUMMARY OF THE INVENTION

A first object of the present invention is to provide a circuit layout enabling placement of circuit elements in a small-width region in a semiconductor integrated circuit having transistors formed as switching elements on a semiconductor substrate, an insulation substrate or a glass substrate and connected to each other.

A second object of the present invention is to provide a circuit layout enabling placement of circuit elements in a small area in a small-width region in a semiconductor integrated circuit having transistors formed as switching elements on a semiconductor substrate, an insulation substrate or a glass substrate and connected to each other.

A third object of the present invention is to provide a layout designing apparatus for enabling a layout in a small-width region.

According to a first aspect of the present invention, there is provided a semiconductor integrated circuit including at least three power supply lines and at least two transistors for changing connections to the power supply lines, wherein the first, second and third power supply lines in the power supply lines are placed in the above-mentioned order, and the at least two transistors include first and second transistors respectively placed in the gap between the first and second power supply lines and the gap between the second and third power supply lines formed on the opposite sides of the second power supply line. In this semiconductor integrated circuit, the overall width of the circuit can be reduced even in terms of the total of the widths of all the power supply lines and the widths of the transistors placed in the gaps between the power supply lines and the circuit can be placed in a small area.

According to a second aspect of the present invention, in the semiconductor integrated circuit according to the first aspect, at least one of the power supply line is extended in wiring to be connected to an external connection terminal. This arrangement ensures that the gate, drain or source electrode is extended to the external terminal so as to avoid an increase in circuit width due to addition of an external connection function.

According to a third aspect of the present invention, in the semiconductor integrated circuit according to the first aspect, a mutual connection line is provided which connects together some of the power supply lines having equal potentials, and the mutual connection line is not connected to any of the power supply lines other than those having equal potentials. This arrangement ensures that, even if the desired circuit is complicated, an increase in complexity of the layout and an increase in the number of external terminals can be limited.

According to a fourth aspect of the present invention, in the semiconductor integrated circuit according to the first aspect, the area occupied by all of the power supply lines is larger than the area occupied by all of the regions between the power supply lines. This arrangement ensures that a voltage drop due to the resistance of the power supply lines and an increase in power consumption can be limited even if the circuit elements are placed in a small-width region.

According to a fifth aspect of the present invention, in the semiconductor integrated circuit according to the first aspect, a gate signal wiring line is provided in order to avoid a delay of a gate signal propagating through the corresponding one of the gate electrodes of the transistors, the gate signal wiring line having a resistance and a parasitic capacitance lower than those of the gate electrode. This arrangement ensures that the time required for a signal input through one end of the gate electrode to reach the other end of the gate electrode is shorter than the time required for signal input through one end of a gate electrode having a larger gate width to reach the other end of this gate electrode.

According to a sixth aspect of the present invention, in the semiconductor integrated circuit according to the first aspect, the transistors are thin-film transistors formed on a glass substrate or an insulation substrate other than a semiconductor substrate. This arrangement makes it possible to provide a display or a sensor in which a peripheral circuit is mounted in a small-width layout on a display substrate or a sensor substrate with integrated thin-film transistors, and which has an increased display area or an increased sensing region.

According to a seventh aspect of the present invention, there is provided a method of manufacturing the semiconductor integrated circuit according to the sixth aspect, the method including advancing crystallization in the gate width direction in a step of crystallizing an amorphous semiconductor layer into a polycrystalline semiconductor. According to this method, the transistors are crystallized simultaneously with each other and the performance variations between the transistors are thereby reduced.

According to an eighth aspect of the present invention, there is provided a charge pump circuit which has the semiconductor integrated circuit according to the first aspect, and which is constituted by a plurality of capacitors and a plurality of transistors. This charge pump circuit can generate from a circuit laid out in a small-width region a plurality of power supply voltages used in a display or a sensor, thereby making it possible to provide a display or a sensor having a small-width frame and a simplified input interface.

According to a ninth aspect of the present invention, there is provided a layout designing apparatus including storage means for storing circuit data on a circuit constituted by a plurality of transistors, search means of searching for a set of routes formed so that passage through any one of the transistors occurs only one time and so that the combination of routes in one set can cover the entire circuit network represented by the circuit data, extraction means of extracting a set of routes having the smallest number of routes in sets of routes found as search results by the search means, layout width determination means of determining a layout width from the widths of source and drain electrodes of each transistor, the width of the region between the source and drain electrodes, the width of the region between the source or drain electrodes of some of the adjacent pairs of the transistors not combined into a common electrode, the number of the transistors, and the number of routes contained in the set of routes extracted by the extraction means, layout determination means of forming information on a layout in which the source, drain, and gate electrodes of the transistors included in the circuit are placed in a small-width region having the width determined by the layout width determination means, and output means of outputting the layout information determined by the layout determination means. This layout designing apparatus can automatically form such a layout that a circuit constituted by a plurality of transistors can be placed in a small-width region.

According to a tenth aspect of the present invention, in the layout designing apparatus according to the ninth aspect, if the width of the source and drain electrodes of each transistor is Wi; the width of the region between the source and drain electrodes is Lj; the width of the region between the source or drain electrodes of some of the adjacent pair of transistors not combined into a common electrode is Pk; the number of the transistors is n; and the number of routes included in the set of routes extracted by the extraction means is m, the width determination means determines a value given by the following expression as the layout width:

$$\sum_{i=1}^{n+m} Wi + \sum_{j=1}^{n} Lj + \sum_{k=1}^{m-1} Pk$$

This arrangement ensures that a layout capable of placing a circuit constituted by a plurality of transistors in a small-width region can be automatically formed.

According to an eleventh aspect of the present invention, in the layout designing apparatus according to the ninth aspect, the width of the region between the source or drain electrodes of some of the adjacent pair of transistors not combined into a common electrode is smaller than the width of the region between the source and drain electrodes. This arrangement ensures that a layout can be automatically formed in which a circuit constituted by a plurality of transistors can be placed in a small-width region having a width smaller by (L–P)(m–1) than that in the case of a layout method in which gate electrodes are uniformly spaced apart from each other and which is ordinarily used in the case of placing a plurality of transistors uniformly spaced apart from each other.

According to a twelfth aspect of the present invention, in the layout designing apparatus according to the ninth aspect, the layout determination means alternately places the source/drain electrodes and the gate electrodes in correspondence with each of the routes in an arbitrary one of the at least one set of routes extracted by the extraction means in the order of passage through the transistors designated with the route or in the order reverse to the passage order. This arrangement does not always ensure that a layout capable of placement in a small area can be obtained, but simplifies the processing for layout designing of a semiconductor integrated circuit capable of being placed in a small-width region.

According to a thirteenth aspect of the present invention, in the layout designing apparatus according to the ninth aspect, a mutual wiring length shortest set determination means is provided which is a means of determining a set of routes having the shortest entire length of mutual wiring for connecting together some of the source or drain electrodes having equal potentials in the at least one set of routes extracted by the extraction means, the order of the plurality of routes contained in the set of routes, and the direction in which each route contained in the set is connected, and the layout determination means alternately places the source/drain electrodes and the gate electrodes in accordance with the set of routes, the order of the plurality of routes contained in the set of routes and the connection direction of each route determined by the mutual wiring length shortest set determination means. This arrangement ensures that a layout capable of placing a circuit constituted by a plurality of transistors in a small area in a small-width region can be automatically formed.

According to a fourteenth aspect of the present invention, in the layout designing apparatus according to the twelfth aspect, the layout determination means determines the placement of a mutual connection line which connects together some of the source or drain electrodes having equal potentials. This arrangement ensures that, even if the desired circuit is complicated, an increase in complexity of the layout and an increase in the number of external terminals can be limited.

According to a fifteenth aspect of the present invention, in the layout designing apparatus according to the twelfth aspect, the layout determination means extends, for connection to an external terminal, the length of at least one of the source and drain electrodes designated as an electrode to be connected to the external terminal according to the circuit data. This arrangement ensures that even in a case where external input/output terminals are concentrated on one side so that the degree of design freedom is low, automatic layout on a semiconductor integrated circuit can be performed so as to connect the circuit to the external input/output terminals without increasing the layout width.

According to a sixteenth aspect of the present invention, there is provided a semiconductor integrated circuit having a structure in which source, drain and gate electrodes of transistors included in a circuit are placed in a small-width region having a width determined from the number of routes in a set of routes having the smallest number of routes in sets of routes formed so that passage through any one of the transistors included in the circuit occurs only one time and so that the combination of routes in one set can cover the entire circuit network of the circuit, determined from the widths of source and drain electrodes of each transistor, determined from the width of the region between the source and drain electrodes, determined from the width of the region between the source or drain electrodes of some of the adjacent pairs of the transistors not combined into a common electrode, and determined from the number of the transistors included in the circuit. This arrangement ensures that a circuit constituted by a plurality of transistors can be placed in a small-width region.

According to a seventeenth aspect of the present invention, in the semiconductor integrated circuit according to the sixteenth aspect, if the width of the source and drain electrodes of each transistor is Wi; the width of the region between the source and drain electrodes is Lj; the width of the region between the source or drain electrodes of some of the adjacent pair of transistors not combined into a common electrode is Pk; the number of the transistors is n; and the number of routes included in the set of routes having the smallest number of routes is m, the small-width region has a width expressed by the following expression:

$$\sum_{i=1}^{n+m} Wi + \sum_{j=1}^{n} Lj + \sum_{k=1}^{m-1} Pk$$

This arrangement ensures that a semiconductor integrated circuit capable of placing a circuit constituted by a plurality of transistors in a small-width region can be obtained.

According to an eighteenth aspect of the present invention, in the semiconductor integrated circuit according to the sixteenth aspect, the width of the region between the source or drain electrodes of some of the adjacent pair of transistors not combined into a common electrode is smaller than the width of the region between the source and drain electrodes. This arrangement ensures that a semiconductor integrated circuit can be obtained which is capable of placing circuit elements in a small-width region having a width smaller by (L−P)(m−1) than that in an ordinary semiconductor integrated circuit in which gate electrodes are uniformly spaced apart from each other.

According to a nineteenth aspect of the present invention, in the semiconductor integrated circuit according to the sixteenth aspect, the source/drain electrodes and the gate electrodes are alternately placed in correspondence with each of the routes in an arbitrary one of the at least one set of routes having the smallest number of routes in the order of passage through the transistors designated with the route or in the order reverse to the passage order. This arrangement does not always ensure that the amount area is sufficiently small, but simplifies the processing for layout designing.

According to a twentieth aspect of the present invention, in the semiconductor integrated circuit according to the sixteenth aspect, the source/drain electrodes and the gate electrodes are alternately placed in accordance with a set of routes having the shortest entire length of mutual wiring for connecting together some of the source or drain electrodes having equal potentials in the sets of routes having the smallest number of routes, in accordance with the order of the plurality of routes contained in the set of routes, and in accordance with the connection direction of each route and the connection direction of each route contained in the set of routes. This arrangement ensures that a semiconductor integrated circuit capable of placing a circuit constituted by a plurality of transistors in a small area in a small-width region can be obtained.

According to a twenty-first aspect of the present invention, in the semiconductor integrated circuit according to the nineteenth aspect, some of the source or drain electrodes having equal potentials are connected to each other by a mutual connection line which extends across the source or drain electrodes. This arrangement ensures that a semiconductor circuit can be obtained in which even if the desired circuit is complicated, an increase in complexity of the layout and an increase in the number of external terminals can be limited.

According to a twenty-second aspect of the present invention, in the semiconductor integrated circuit according to the nineteenth aspect, at least one of the source and drain electrodes of the transistors to be connected to an external terminal is extended for connection to the external terminal. This arrangement ensures that a semiconductor integrated circuit can be provided which is capable of being connected to external input/output terminals without increasing the layout width even in a case where the external input/output terminals are concentrated on one side so that the degree of design freedom is low.

According to a twenty-third aspect of the present invention, there is provided a semiconductor integrated circuit according to the sixteenth aspect, the transistors are thin-film transistors formed on a glass substrate or an insulation substrate other than a semiconductor substrate. This arrangement makes it possible to provide a display or a sensor in which a peripheral circuit is mounted in a small-width layout on a display substrate or a sensor substrate with integrated thin-film transistors, and which has an increased display area or an increased sensing region.

According to a twenty-fourth aspect of the present invention, there is provided a method of manufacturing the semiconductor integrated circuit according to the twenty-third aspect, including advancing crystallization in the gate width direction in a step of crystallizing an amorphous semiconductor layer into a polycrystalline semiconductor. According to this method, the transistors can be crystallized simultaneously with each other and performance variations between the transistors are thereby reduced.

BRIEF DESCRIPTION OF THE DRAWINGS

FIG. 22 is a diagram showing an example of permutation data tb1;

FIG. 26 is a diagram showing an example of concatenated route Rbuf (Nmin=2);

FIG. 28 is a diagram showing an example of concatenated route Rbuf, mutual connection data M and total mutual connection wiring length SUM;

FIG. 30 is a diagram showing the results of execution of the automatic layout algorithm;

DETAILED DESCRIPTION OF THE PREFERRED EMBODIMENTS

Figure 1:
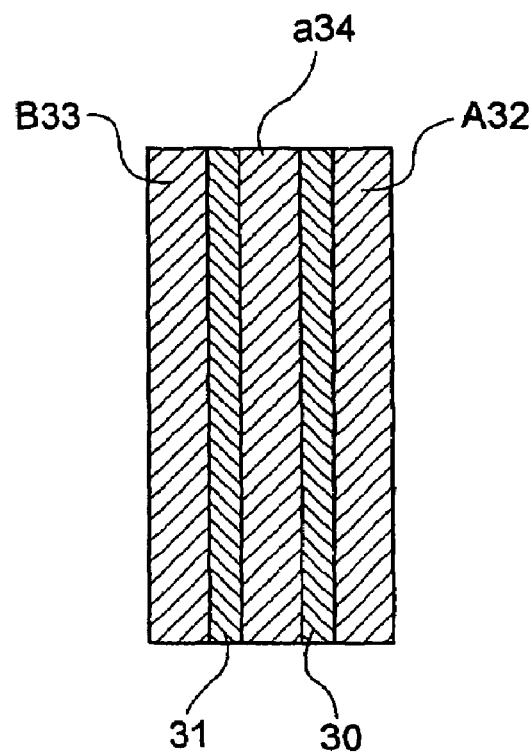
FIG. 1 is a diagram showing a layout which represents a first embodiment of the present invention.
Figure 2:
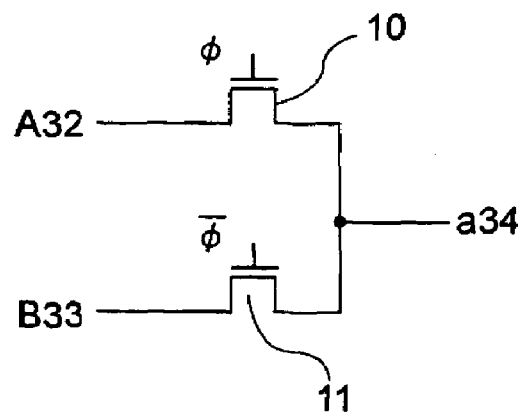
FIG. 2 is a diagram showing a power supply line switch circuit.

Embodiments of the present invention will be described in detail with reference to the accompanying drawings. FIG. 1 shows a layout which represents a first embodiment of the present invention. This layout corresponds to the circuit shown in FIG. 2 as a circuit for switching the connection of a power supply line a34 between power supply lines A32 and B33. The power supply lines A32, a34, and B33 are placed in the above-mentioned order, and transistors 10 and 11 are placed in the gaps between the power supply lines A32, a34, and B33. In the layout shown in FIG. 1, each transistor has one gate electrode. The gate electrode of the transistor 10 is indicated by 30 and the gate electrode of the transistor 11 is indicated by 31. The gate electrodes 30 and 31 are placed on the opposite sides of the power supply line a34, and each gate electrode is formed by a gate layer. The power supply lines are each formed by a first metal layer and are electrically connected to active regions in the bodies of the transistors through contacts (not shown).

Figure 34:
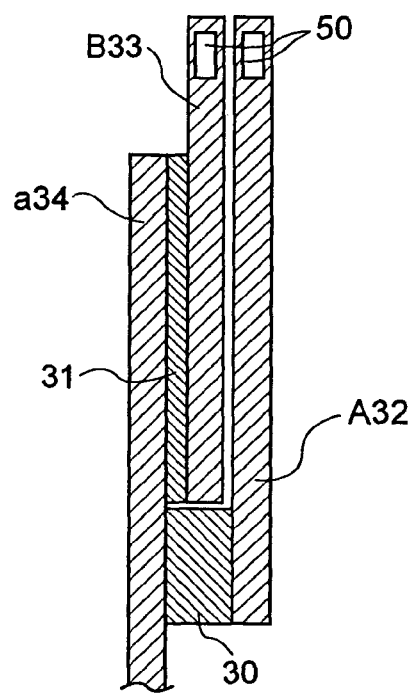
FIG. 34 is a diagram showing an example of an arrangement in which the gate 30 is formed in such a manner that it is divided into sections and the sections are placed parallel to each other.

The minimum of the width of the region occupied by one transistor constituted by gate, source and drain electrodes is the sum of the gate length Lg and the widths W of the source and drain electrodes (Lg+2W). For ease of description, the spacing between the gate electrode and the source or drain electrode is assumed to be zero. If two transistors thus formed are arranged in the gate length direction, the width of the two transistors is twice that of one transistor, i.e., 2Lg+4W. In a case where the sources or drains of two transistors are connected in series like those in the circuit shown in FIG. 2, the circuit width can be reduced to 2Lg+3W because the two electrodes can be combined into one common electrode, as are those in this embodiment shown in FIG. 1. The area occupied by the whole of this layout is roughly calculated as (2Lg+3W)×Wg since the length of the circuit corresponds to the gate width Wg. The area of this layout is always smaller by 2Lg×W/(Lg+W) than that of the layout in which the same circuit is arranged as shown in FIG. 34.

Figure 3:
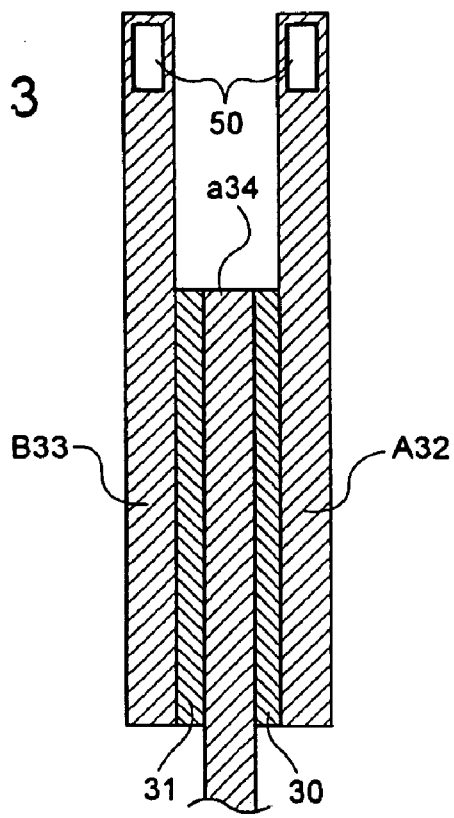
FIG. 3 is a diagram showing a layout which represents a second embodiment of the present invention.

FIG. 3 is a diagram showing a layout which represents a second embodiment of the present invention. In this embodiment, a function for connection to external terminals 50 concentrated on one side is added to the layout shown in FIG. 1. To externally apply potentials to the power supply lines A32 and B33, the power supply lines are extended upward as viewed in the figure in wiring using the first metal layer, thereby enabling connection through external connection terminals 50. The power supply line a34 is extended downward as viewed in the figure as wiring for connection to another internal circuit. This layout is characterized by avoiding an increase in width of the circuit layout even though wiring extensions are made.

Figure 4:
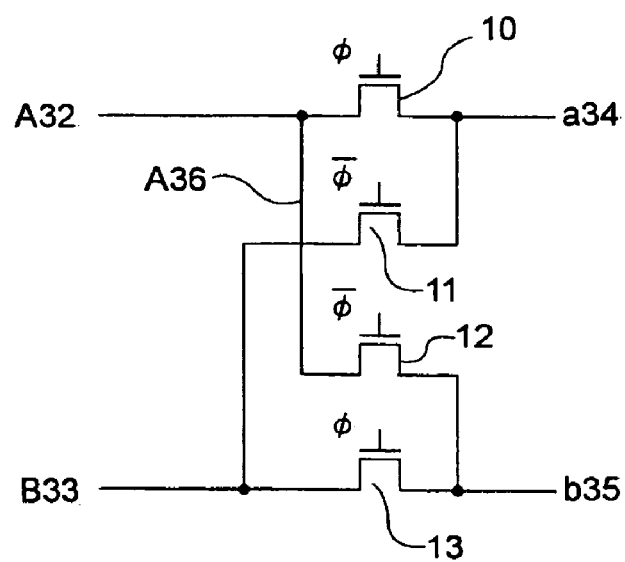
FIG. 4 is a diagram showing a power supply line switch circuit.
Figure 5:
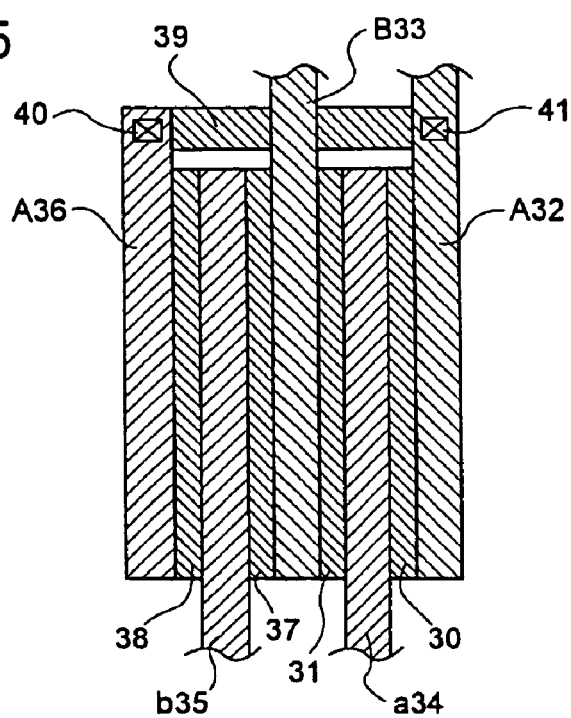
FIG. 5 is a diagram showing a layout which represents a third embodiment of the present invention.

FIG. 5 is a diagram showing a layout which represents a third embodiment of the present invention. This layout corresponds to a wiring switching circuit shown in FIG. 4. In this circuit, connections are exclusively made between power supply lines A32 and B33 and power supply lines a34 and b35. This circuit operates as described below. When the gate signal φ is high level, the transistors 10 and 13 are in the on state, the power supply lines A32 and a34 are connected to each other, and the power supply lines B33 and the power supply line b35 are also connected to each other. When the gate signal φ is low level, the transistors 11 and 12 are in the on state and reverse connections are established, that is, the power supply lines A32 and b35 are connected to each other, and the power supply lines B33 and the power supply line a34 are connected to each other namely resulting in reverse connection. For example, this circuit is used as a polarity reversing circuit. The power supply lines a34 and b35 are set to high and low potentials, respectively, by the gate signal φ while maintaining the input power supply lines A32 and B33 at a high and low potentials, respectively. Also, switching can be made to set the power supply lines a34 and b35 to low and high potentials, respectively.

Figure 6:
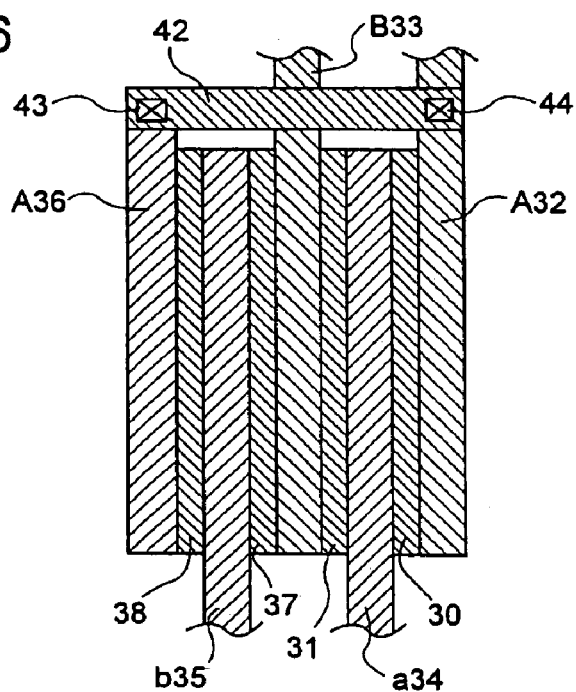
FIG. 6 is a diagram showing another layout according to the third embodiment of the present invention.

The layout is such that the power supply lines A32, a34, B33, b35, and A36 are placed in the above-mentioned order, and the transistor is placed in the gap between each adjacent pair of the power supply lines. That is, the transistor 10 and its gate electrode 30 are placed between the power supply lines A32 and a34; the transistor 11 and its gate electrode 31 between the power supply lines a34 and B33; the transistor 13 and its gate electrode 37 between the power supply lines B33 and b35; and the transistor 12 and its gate electrode 38 between the power supply lines b35 and A36. As can be understood from the circuit diagram of FIG. 4, it is necessary to apply the same potential to the power supply lines A32 and A36. This embodiment is characterized by the provision of a mutual connection line 39 for connecting the two power supply lines A32 and A36 while avoiding connection to the power supply line B33. The mutual connection line 39 intersects each power supply line at right angles. In the layout shown in FIG. 5, the mutual connection line 39 is formed by the gate layer and is connected through the contacts 40 and 41 to the power supply lines A32 and A36 formed by the first metal layer. In the layout shown in FIG. 6, a mutual connection line 42 is formed by a second metal layer and is connected through the contacts 43 and 44 to the power supply lines A32 and A36 formed by the first metal layer. A plurality of contacts may be formed as each of the contacts 40, 41, 43, and 44 instead of the illustrated one contact.

Figure 7:
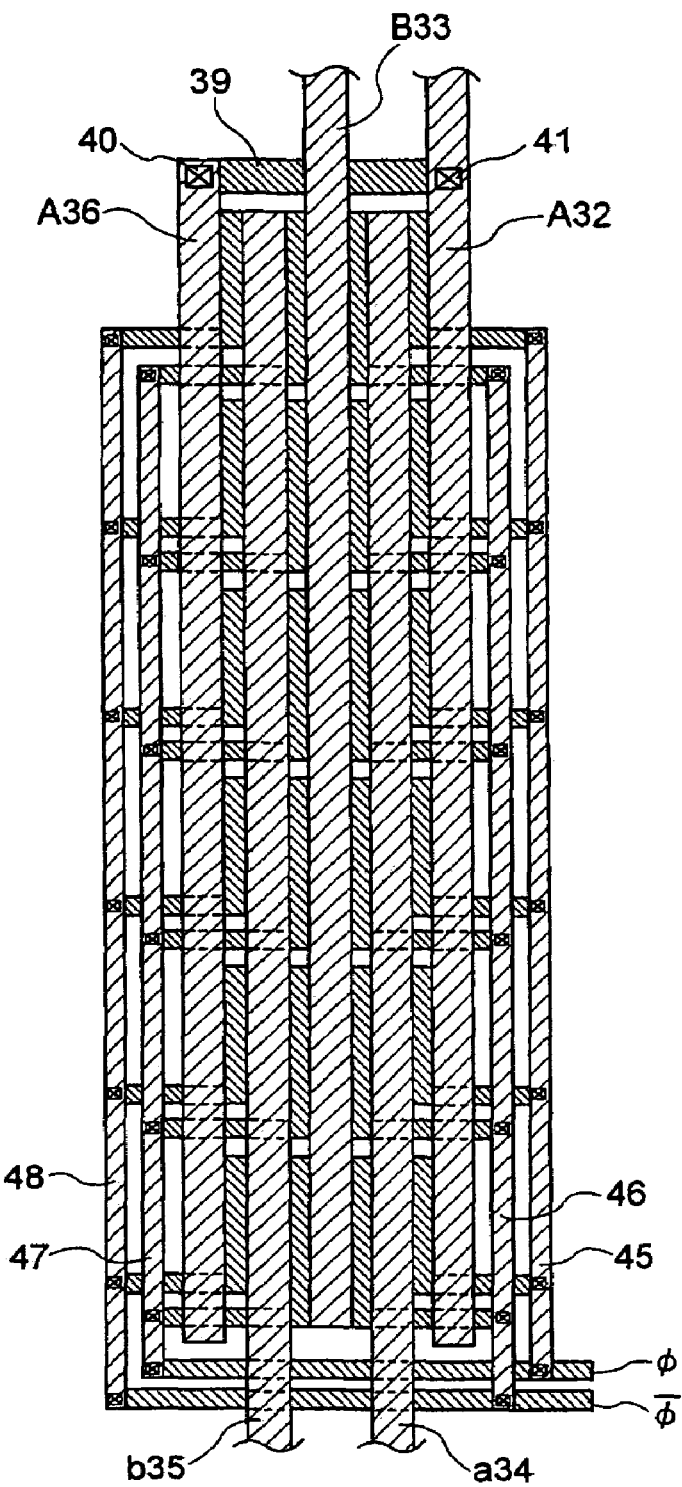
FIG. 7 is a diagram showing a layout which represents a fourth embodiment of the present invention.

FIG. 7 is a diagram showing a layout which represents a fourth embodiment of the present invention. This layout corresponds to the wiring switching circuit shown in FIG. 4. This embodiment is characterized by providing gate signal lines 45, 46, 47, and 48 for propagation of the gate signal φ and the obtained by inverting the gate signal. The resistance of the gate signal lines 45, 46, 47, and 48 is smaller than that of the gate electrodes. Also, the parasitic capacitance of the gate signal lines is lower than that of the gate electrodes. For example, the gate signal lines are formed in the first metal layer to improve the gate signal propagation speed determined by a CR time constant. In this manner, a switching time delay is reduced even in a case where large-gate-width transistors are used for a narrow circuit layout.

Figure 8:
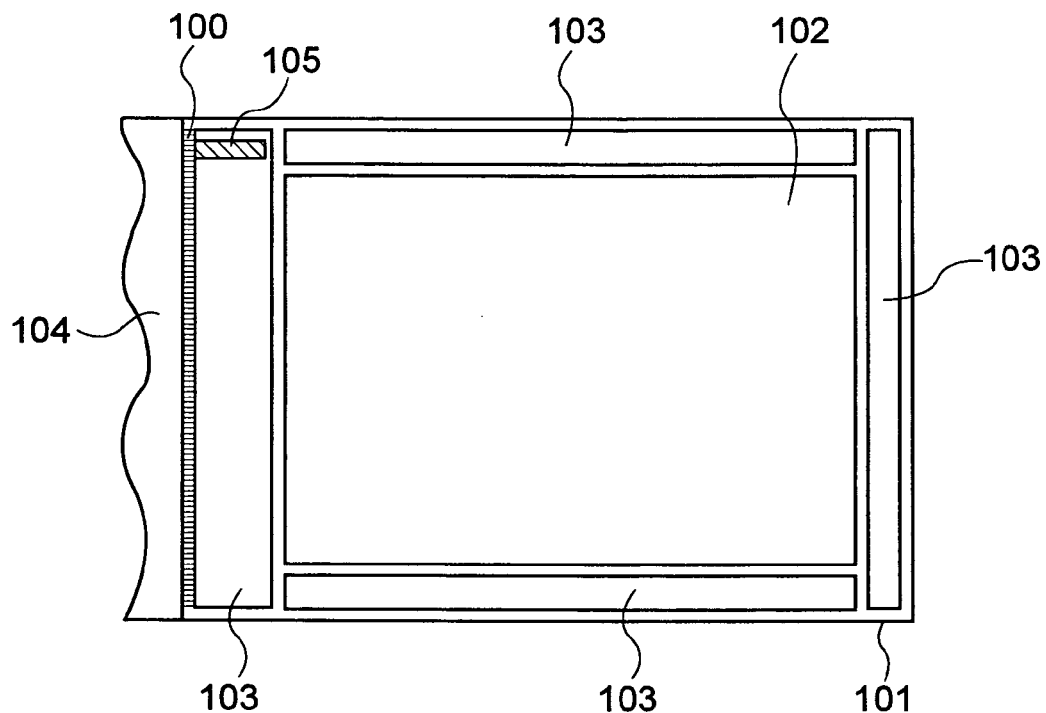
FIG. 8 is a diagram showing an example of a circuit layout of a display or a sensor which represents a fifth embodiment of the present invention.
Figure 9:
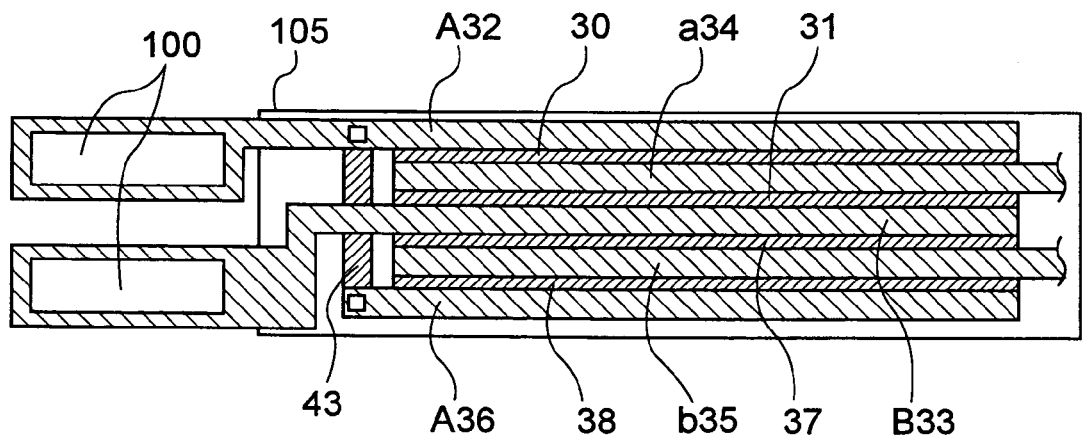
FIG. 9 is an enlarged circuit layout diagram of the display or the sensor.

FIG. 8 is a diagram showing a fifth embodiment of the present invention, which is a display device or a sensor. The display device or the sensor is constituted by display elements or sensor elements placed in matrix form in a display region or a sensing region 102, active matrix transistors for respectively driving the display elements or the sensor elements, peripheral circuits 103, a multilayer printed circuit board 104 through which external signals and power are input or output, and a connection terminal 100. The active matrix transistors and the peripheral circuits 103 are constituted by thin film transistors formed on an insulation substrate or glass substrate 101 different from a semiconductor substrate. In the arrangement shown in FIG. 8, the wiring switching circuit shown in FIG. 4, for example, is placed in a peripheral circuit region 105. This circuit is used for the purpose of switching between power supply voltages, or the like. Referring to an enlarged diagram shown in FIG. 9, the layout of the circuit is the same as that shown in FIG. 5, and electrodes A32 and B33 are extended for connection to the external connection terminal 100, and the power supply lines a34 and b35 are extended for connection to internal circuits.

Figure 10:
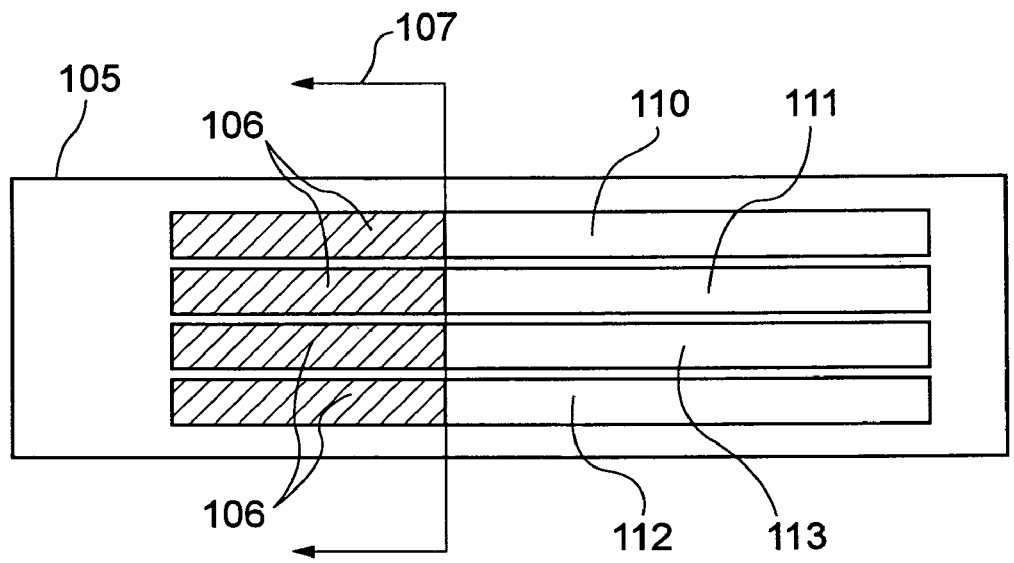
FIG. 10 is a diagram showing a silicon polycrystallization step for a thin-film transistor circuit which represents a sixth embodiment of the present invention.
Figure 11:
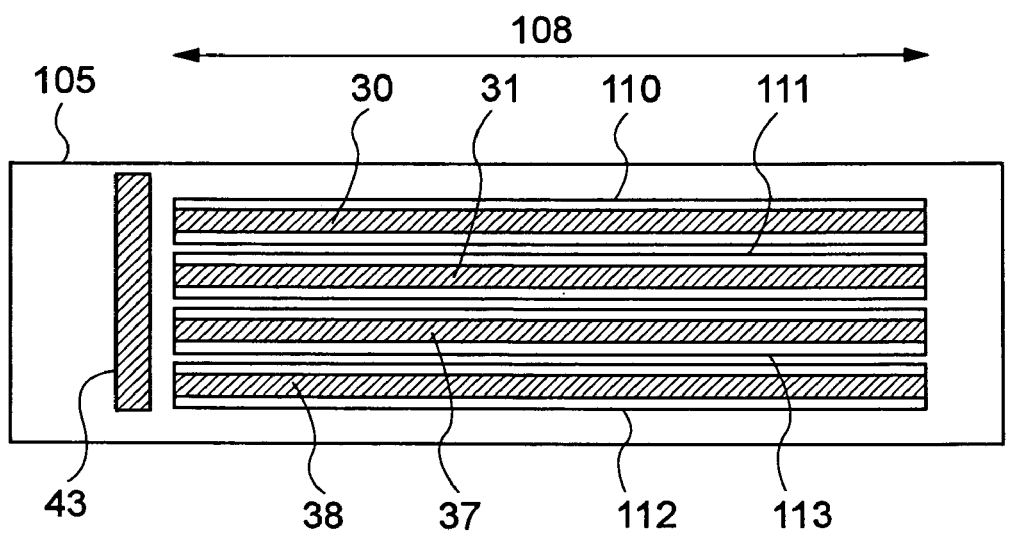
FIG. 11 is a diagram showing a gate electrode forming step for the thin-film transistor circuit.

FIGS. 10 and 11 are diagrams showing a thin-film transistor manufacturing process which represents a sixth embodiment of the present invention. Thin-film transistors constituting peripheral circuits 103 are polycrystalline semiconductors 110 to 113 formed by performing laser annealing or the like for a polycrystallization process on an amorphous semiconductor 106 grown on the glass substrate 101. Forming of islands 110 to 113 of transistors 10 to 13 is performing by photoetching or the like. The islands 110 to 113 may be formed simultaneously with or after polycrystallization. Next, a gate insulation film (not shown) is formed and gate electrodes 30, 31, 37, 38, and 43 are formed on the gate insulation film, as shown in FIG. 11. After forming contact holes, source and drain electrodes A32, B33, a34, b35, and A36 are formed by the first metal layer. The contact holes are provided for the purpose of establishing electrical connections between the polycrystalline semiconductor islands 110 to 113 and the first layer metal electrodes as well as electrical connections between a mutual connection line 43 and electrodes A32 and A36.

This embodiment is characterized in that, as shown in FIG. 10, the direction 107 in which crystallization progresses and the gate width direction 108 are made parallel to each other in the process of crystallizing an amorphous semiconductor 106. The plurality of transistors arranged parallel to each other in the gate length direction can be simultaneously crystallized in this process. Performance variation between the arranged transistors can be limited even if variations in temperature and thermal conductions occur in the crystallization process.

A layout designing apparatus for automatically forming layouts such as those described above the embodiments will next be described as a seventh embodiment of the present invention with reference to FIG. 12.

Figure 12:
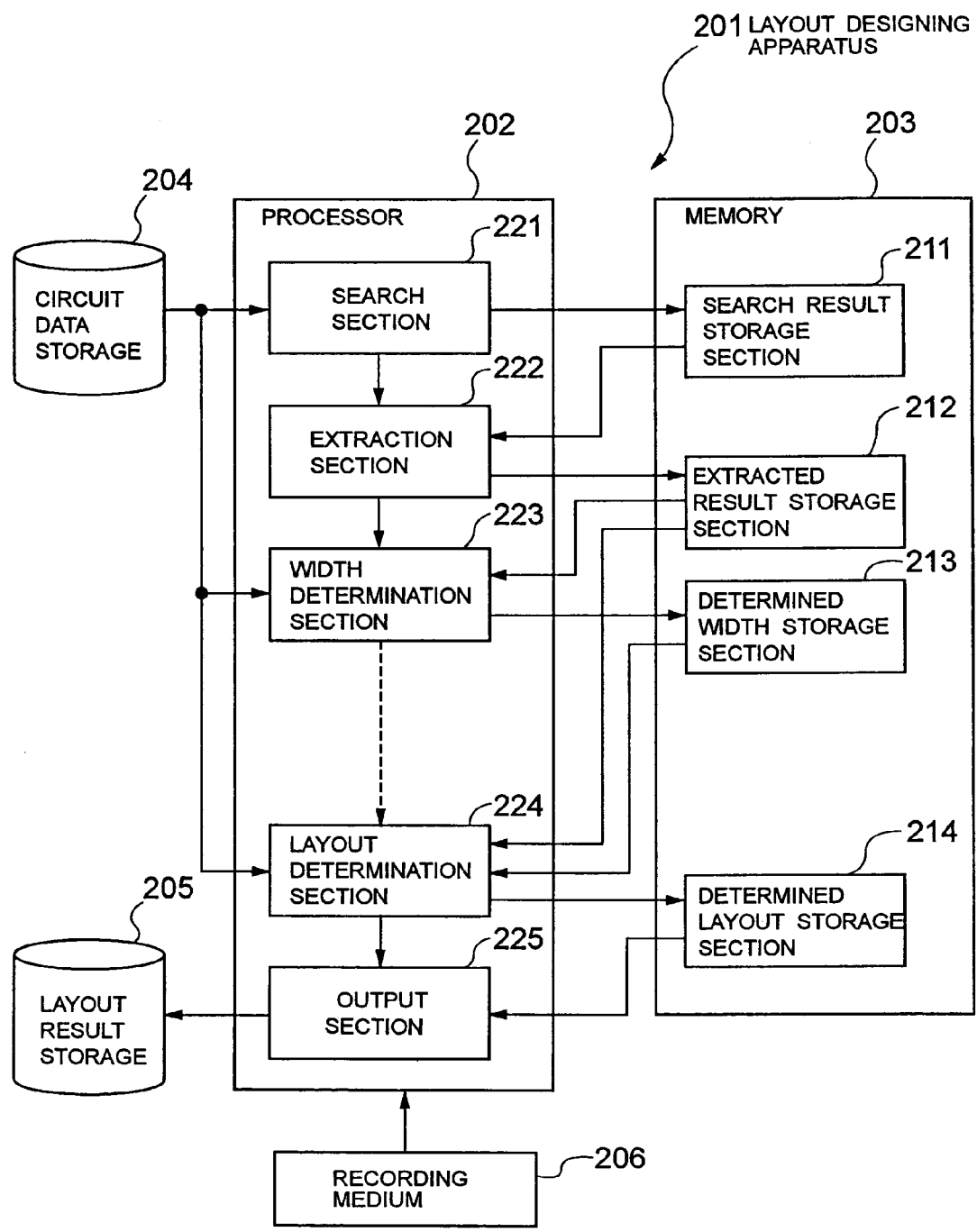
FIG. 12 is a block diagram of a layout designing apparatus which represents a seventh embodiment of the present invention.

Referring to FIG. 12, the layout designing apparatus 201 of this embodiment is constituted by a processor 202, a memory 203, a circuit data storage 204, a layout result storage 205, and a recording medium 206. The memory 203 includes a search result storage section 211, an extracted result storage section 212, a determined width storage section 213, and a determined layout storage section 214. The processor 202 includes a search section 221, an extraction section 222, a width determination section 223, a layout determination section 224, and an output section 225.

The circuit data storage 204 is a storage means using a magnetic disk or the like for storing circuit data on a circuit which is constituted by a plurality of transistors and on which layout designing is performed. The layout result storage section 205 is a storage means using a magnetic disk or the like for storing information on a designed layout.

The memory 203 is constituted by a main memory of a computer, and the processor 202 is constituted by a CPU of the computer. The recording medium 206 is a computer-readable recording medium such as a magnetic disk or a CD-ROM on which a layout designing program is recorded. The layout designing program recorded on the recording medium 206 is read by the CPU constituting the processor 202 and used to control the operation of the processor 202, thereby realizing the search section 221, the extraction section 222, the width determination section 223, the layout determination section 224 and the output section 225 on the processor 202.

The search section 221 inputs the circuit data from the circuit data storage 204 and searches for at least one set of routes in which passage through one transistor occurs only one time. The combination of routes in the same set can cover the circuit network represented by the circuit data. The search section 221 stores the search result in the storage section 211.

The extraction section 222 inputs the search result from the storage section 211, extracts at least one set of routes having the smallest number of routes contained, and records the extraction result in the storage section 212.

The width determination section 223 inputs the circuit data from the circuit data storage section 204 and with information on the number of routes in the set of routes having the smallest number of routes from the storage section 212, computes the layout width, and records the computation result in the storage section 213. The width determination section 223 computes the layout width from the widths of the source and drain electrodes of each transistor, the width of the region between the source and drain electrodes of each transistor, the width of the region between the source or drain electrodes of some of the adjacent pairs of the transistors not combined into a common electrode, the number of transistors contained in the circuit to be laid out, and the number of routes.

For example, if the width of each of the source and drain electrodes of each transistor is W; the width of the region between the source and drain electrodes is L; the width of the region between the source or drain electrodes of some of the adjacent pairs of the transistors not combined into a common electrode is P; the number of transistors is n, and the number of routes is m, the width determination section 223 computes the layout width by the following expression:

$$\text{Layout width} = W(n+m) + L(n+m-1) - (L-P)(m-1) \quad (1)$$

While the gate electrode is provided in the region between the source and drain electrodes, the width of the region between the source or drain electrodes of some of the adjacent pairs of the transistors not combined into a common electrode can be set to a minimum distance in accordance of a mask rule. In general, therefore, P<L can be satisfied.

In the case of use of the equation (1), all source and drain electrodes are assumed to be equal in width to each other. The source and drain electrodes may be not equal in width. For example, the width of particular one(s) of the source and drain electrodes may be larger than that of the others. In such a case, the layout width may be computed by considering the difference between the widths of the source and drain electrodes. Also in a case where the regions between the source and drain electrodes are not equal in width, or in a case where the regions between the source or drain electrodes in some of the adjacent pairs of the transistors not combined into a common electrode are not equal in width, the layout width may be computed by considering the actual widths. More specifically, if Wi represents the widths of the source and drain electrodes of the transistors; Lj, the regions between the source and drain electrodes; Pk, the widths of the regions between the source or drain electrodes of some of the adjacent pair of transistors not combined into a common electrode; n, the number of transistors; and m, the number of routes, the layout width is obtained by the following expression:

$$\sum_{i=1}^{n+m} Wi + \sum_{j=1}^{n} Lj + \sum_{k=1}^{m-1} Pk \quad (2)$$

Actual values of Wi, Lj, and Pk can be stored as part of the circuit data in the circuit data storage 204. Needless to say, they may be separately designated as parameters.

The layout determination section 224 inputs the circuit data from the circuit data storage 204 and inputs information on the layout width from the storage section 213, and generates information on a layout in which all the source, drain and gate electrodes of the transistors according to the circuit data are placed in a small-width region having the layout width according to the information. In this embodiment, the layout determination section 224 inputs data on arbitrary one of the sets of routes from the storage section 212 and alternately places the source/drain electrodes and the gate electrodes in correspondence with the routes in the set in the order of passage through the transistors designated with the routes or in the order reverse to the passage order. The layout determination section 224 also determines the placement of mutual connections each made to connect some of the sources or drain electrodes having the same potential. Further, the layout determination section 224 extends, for connection to external terminals, the lengths of the source and drain electrodes designated by the circuit data as electrodes to be connected to the external terminals. The layout determination section 224 records in the storage section 214 the information on the layout thus determined.

The output section 225 inputs the layout information from the storage section 214 and outputs the layout results to the layout result storage 205. The output of layout information is not limited to the output to the layout result storage 205. The layout information may be output to a printer not shown or a display.

A semiconductor integrated circuit is manufactured in accordance with the layout information output to the layout result storage 205. The manufactured semiconductor integrated circuit has such a structure that all the source, drain and gate electrodes of the transistors according to the circuit data are placed in a small-width region having the width determined from the number of routes in a set of routes having the smallest number of routes in at least one set of routes formed so that passage through one transistor occurs only one time and so that the combination of routes in one set can cover the circuit network represented by the circuit data, the widths of the source and drain electrodes of the transistors, the widths of the regions between the source and drain electrodes, the widths of the regions between the source or drain electrodes of some of the adjacent pairs of the transistors not combined into a common electrode, and the number of transistors in the circuit data.

Figure 13:
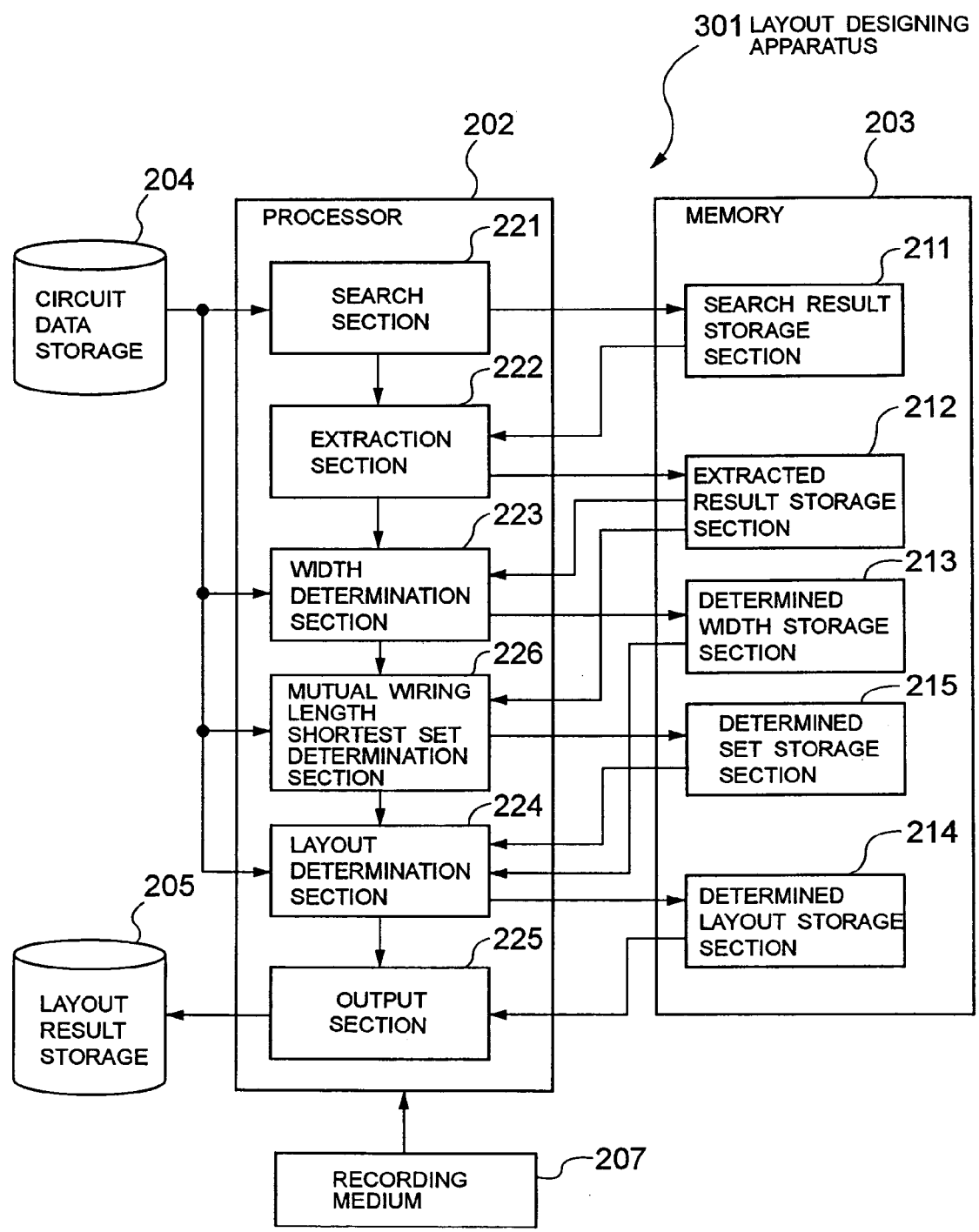
FIG. 13 is a block diagram of a layout designing apparatus which represents an eighth embodiment of the present invention.

FIG. 13 is a block diagram of a layout designing apparatus which represents an eighth embodiment of the present invention. The configuration of the layout designing apparatus 301 of this embodiment differs from that of the layout designing apparatus 201 shown in FIG. 12 in that a mutual wiring length shortest set determination section 226 is provided in the processor 202 and a determined set storage section 215 is provided in the memory 203. Also, the functions of the layout determination section 224 of the layout designing apparatus 301 differs partly from those of the layout determination section 224 of the layout designing apparatus 201. A recording medium 207 is a computer-readable recording medium such as a magnetic disk on which a layout designing program is recorded. The layout designing program recorded on the recording medium 207 is read by the CPU constituting the processor 202 and used to control the operation of the processor 202, thereby realizing the search section 221, the extraction section 222, the width determination section 223, the layout determination section 224, the output section 225 and the mutual wiring length shortest set determination section 226 on the processor 202. The operation of the layout designing apparatus 301 of this embodiment will now be described.

Each of the search section 221, the extraction section 222 and the width determination section 223 performs the same processing as that performed by the corresponding section in the layout designing apparatus 201 shown in FIG. 12. The mutual wiring length shortest set determination section 226 inputs circuit data from the circuit data storage 204 and inputs data on all sets of routes having the shortest number of routes from the storage section 212, determines, in the supplied sets of routes, a set of routes having the shortest total length of mutual wiring for establishing a mutual connection between some of the source or drain electrodes having the same potential, the order of the plurality of routes contained in the set, and the connection direction of each route in the set, and records the determined information items in the storage section 215.

The layout determination section 224 inputs the circuit data from the circuit data storage 204 and inputs information on the layout width from the storage section 213, and generates information on a layout in which all the source, drain and gate electrodes of the transistors according to the circuit data are placed in a small-width region having the layout width according to the information. In this embodiment, the layout determination section 224 inputs data on arbitrary one of the sets of routes, the order of the plurality of routes contained in the set and the connection direction of each route contained in the set from the storage section 213, and alternately places the source/drain electrodes and the gate electrodes in accordance with the routes in the set, the order of the plurality of routes contained in the set and the connection directions of the routes in the set.

The other kinds of processing performed by the layout determination section 224 and processing performed by the output section 225 are the same as those in the layout designing apparatus 201 shown in FIG. 12.

A semiconductor integrated circuit is manufactured in accordance with the layout information output to the layout result storage 205. The manufactured semiconductor integrated circuit has such a structure that all the source, drain and gate electrodes of the transistors according to the circuit data are placed in a small-width region having the width determined from the number of routes in a set of routes having the smallest number of routes in at least one set of routes formed so that passage through one transistor occurs only one time and so that the combination of routes in one set can cover the circuit network represented by the circuit data, the widths of the source and drain electrodes of the transistors, the widths of the regions between the source and drain electrodes, the widths of the regions between the source or drain electrodes of some of the adjacent pairs of the transistors not combined into a common electrode, and the number of transistors in the circuit data. In this respect, the layout designing apparatus 301 of this embodiment is the same as the layout designing apparatus 201 shown in FIG. 12. In general, however, the layout designing apparatus 301 of this embodiment reduces the area occupied by the circuit in comparison with the layout designing apparatus 201 shown in FIG. 12. Because the source/drain electrodes and the gate electrodes are alternately placed in accordance with the set of routes having the shortest total length of mutual wiring for establishing a mutual connection between some of the source or drain electrodes having the same potential in the sets of routes having the smallest number of routes, the order of the plurality of routes contained in the set, and the connection directions of the routes in the set.

An example of implementation of the layout designing apparatus of the present invention will be described with reference to the drawings. The example of implementation described below corresponds to the eighth embodiment of the present invention.

Figure 14:
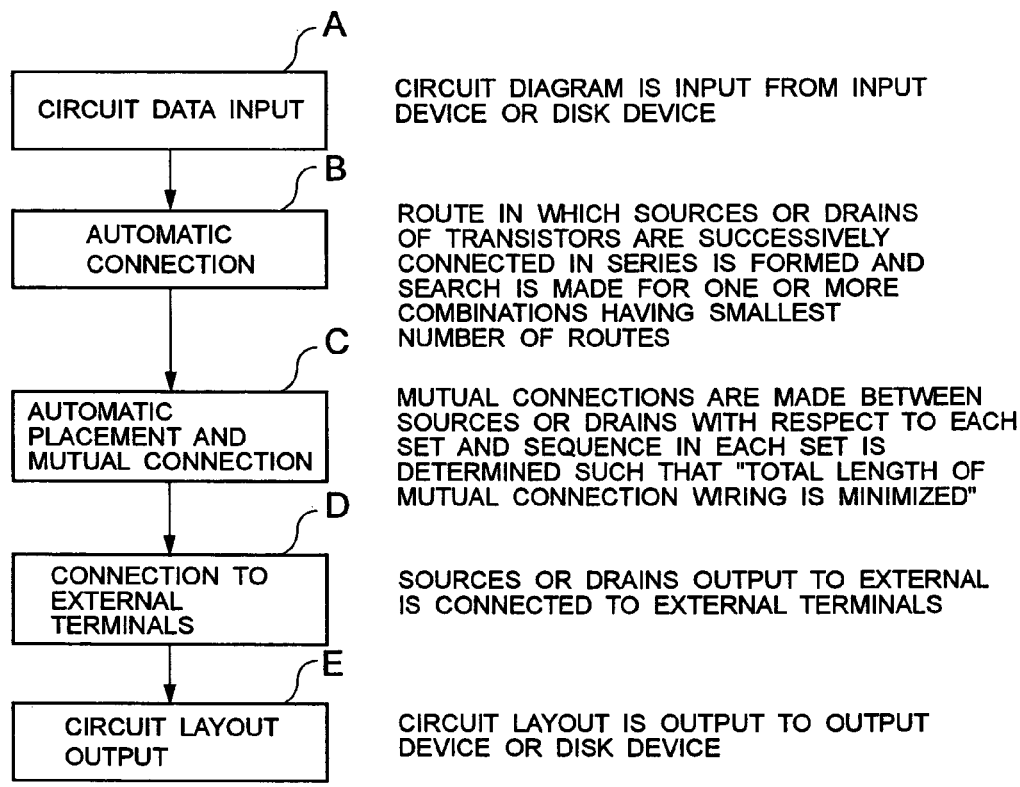
FIG. 14 is a flowchart of an automatic layout forming algorithm in an example of implementation of the invention according to the eighth embodiment.
Figure 15:
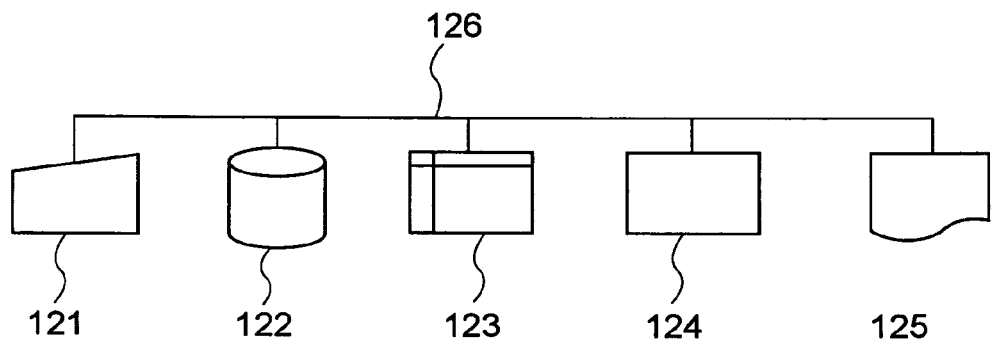
FIG. 15 is a system block diagram showing automatic layout formation in the example of implementation according to the eighth embodiment.

FIG. 14 is a flowchart showing the outline of a layout determination algorithm used in the layout designing apparatus in this example of implementation. FIG. 15 is a diagram showing the system configuration of the layout designing apparatus in this example of implementation.

In "circuit data input" (step A), data on a circuit to be laid-out, i.e., information on connections in a circuit, is obtained from an input device/console 121, a disk unit 122 or an internal storage 123 and is processed to be changed into array data, which is stored in the internal storage 123.

In "automatic connection" (step B), a route (written with a single stroke) in which the source or drain electrodes are successively connected in series so that the circuit width is minimized, that is, the number of source and drain electrodes not combined into any common electrode is minimized is first formed from the circuit network. If passage through all the transistors cannot be made in one series-connection route, a "set of routes" is formed such that passage through all the transistors is made along a plurality of routes. Sets of routes formed in this manner are searched for at least one "set of routes" having the smallest number of routes.

In "automatic placement and mutual connection" (step C), mutual connections for forming the desired circuit are made between the routes in combinations determined in the preceding step, and a search is made for the combination and a sequence of sets having the minimum of the total length of lines for mutual connection.

In "connection to external terminals" (step D), the source or drain electrodes to be connected external terminals, excluding overlaps, are extended to be connected to the external terminals.

In "circuit layout output" (step E), data on the arrangement of the transistors, the mutual connections and the wiring to the external terminals are recorded as array data, a chart or a layout diagram in the internal storage 123 or the disk device 122, and are output through an output device 125.

In the above-described steps, data exchange between the blocks is performed through a bus line 126 and processing for a search, etc., and control of each block are performed by a computation and control section 124. The computation and control section 124 executes processing for a search, etc., and control of each block, for example, by executing the layout designing program stored in the disk device 122.

The operation of the layout designing apparatus in this example of implementation will be described in detail with respect to a layout design of a charge-pump-type voltage boosting circuit with reference to the drawings.

Figure 16:
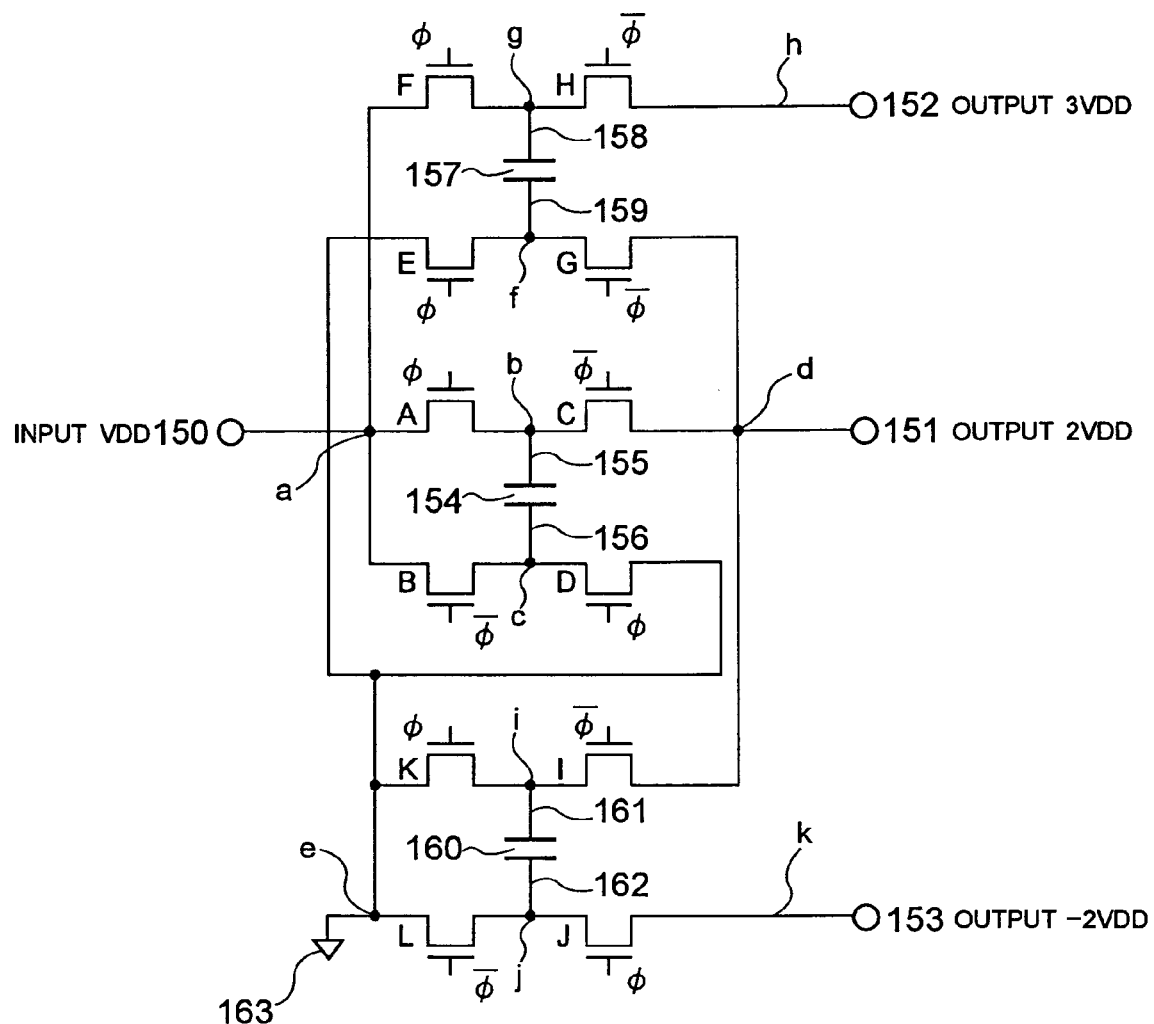
FIG. 16 is a diagram showing a charge-pump-type voltage boosting circuit.

FIG. 16 shows an example of a charge-pump-type voltage boosting circuit constituted by capacitors and electronic switches. This circuit functions as a power supply circuit generating, for example, 2×, 3×, and −2× boosted voltages from an input power supply voltage VDD. The advantage of the arrangement of this voltage boosting circuit in a small-width layout in the peripheral circuit region 103 shown in FIG. 8 resides in that only a low voltage VDD is externally supplied as a power supply voltage and, therefore, the input interface can be simplified. As power supply voltages higher than VDD and a negative power supply voltage required for other peripheral circuits, e.g., a gate drive circuit and a data drive circuit for an active matrix, the above-mentioned 2×, 3×, and −2× boosted voltages may be used.

The voltage-boosting operation of the circuit shown in FIG. 16 is performed in such a manner that the connections to the capacitors 154, 157, and 160 are changed by controlling the transistor switches A to L through a gate signal φ and the inverted signal of the gate signal. When the gate signal φ is high level, the transistors A and D are on and the capacitor 154 is charged at the input power supply voltage VDD 150. Simultaneously, the transistors F and E are on and the capacitor 157 is charged at the input power supply voltage VDD 150. When the gate signal φ becomes low level, the transistors B and C are turned on to connect the capacitor 154 to the input power supply in series. The potential of the output terminal 151 is thereby boosted to 2×VDD. Simultaneously, the transistors G and H are turned on to connect the capacitor 157 to the input power supply 150 and the capacitor 154 in series. The potential of the output terminal 152 is thereby boosted to 3×VDD. On the other hand, when the gate signal φ is low level, the transistors I and L are on and the capacitor 160 is charged at the potential of the output terminal 151, i.e., 2×VDD. When the gate signal φ becomes high level again, the transistors K and J are turned on to set the high-potential side of the capacitor 160 to the same potential as that of a ground point 163. The potential of the capacitor 160 on the low-potential side, i.e., the potential of the output terminal 153, is thereby set to −2×VDD opposite in polarity to the charging voltage. A voltage holding capacitor (not shown) is connected to each of the output terminals 151, 152, and 153 to hold the boosted voltage.

If the above-described voltage-boosting circuit supplies a current of about 1 mA to a load, and if the clock frequency of the gate signal is 10 kHz and variations in voltage are 0.1 V or less, the necessary capacity of the voltage holding capacitor is about 1 mA/(0.1 V×10 kHz)=1 µF. If the capacitor has such a high capacity, it is necessary to mount the capacity outside the semiconductor integrated circuit. Through any of the wiring conductors connected between the input power supply 150, the output terminals 151, 152, and 153, the externally mounted capacitors 154, 157, and 160, and the transistors A to L, the current corresponding to a current to be output flows. Therefore the wiring conductors are treated as power supply wiring.

The process of determining the layout of the circuit shown in FIG. 16 in accordance with the layout determination algorithm shown in FIG. 14 will now be described.

Figure 17:
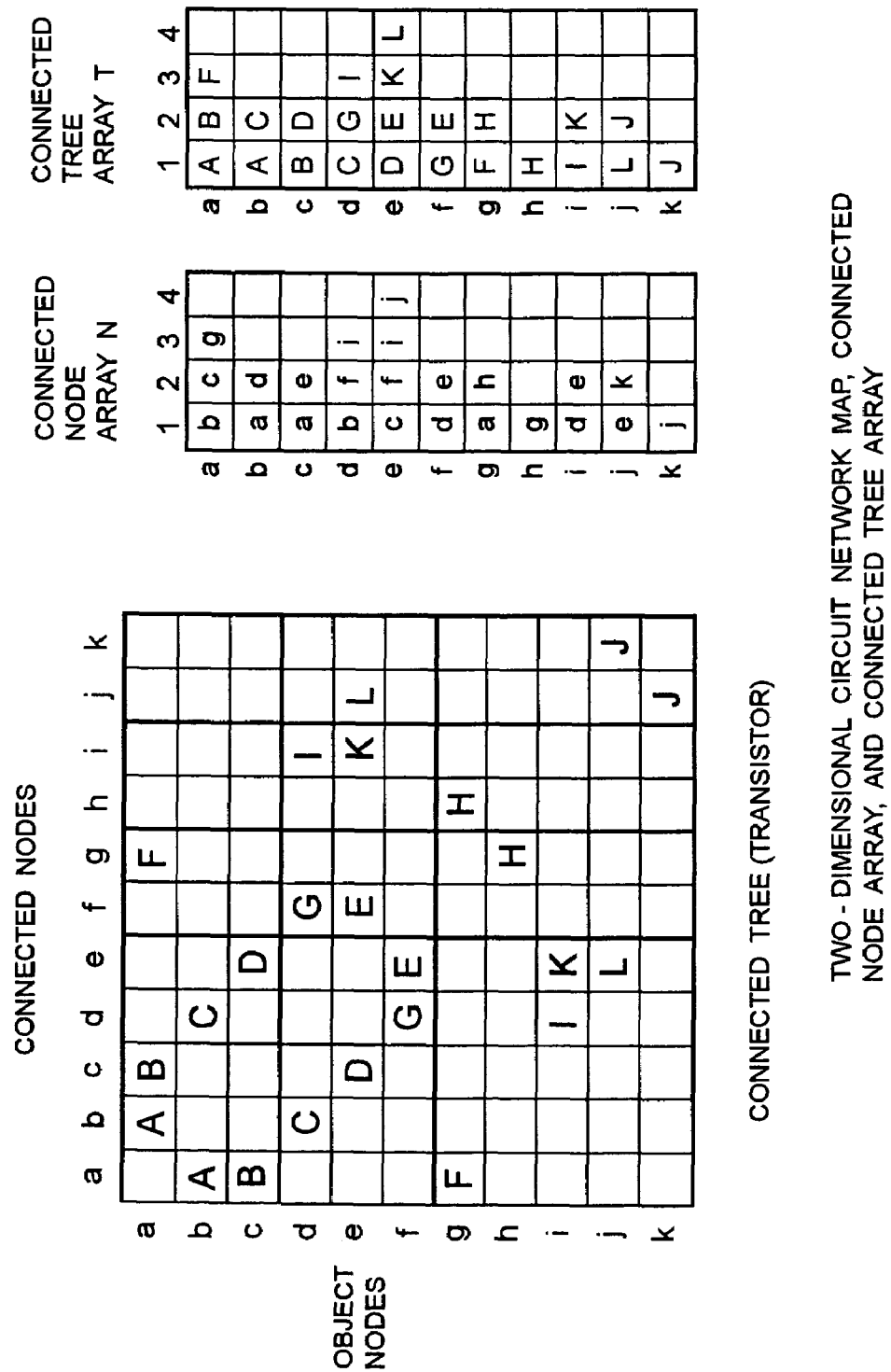
FIG. 17 is a diagram showing a two-dimensional circuit network map, a connected node array and a connected tree array.

In the circuit data input step (step A), processing described below is performed. First, nodes (contacts) constituting the circuit are marked with a sequence of characters a, b, . . . , k and trees (transistors in this case) are marked with A, B, . . . , L. Next, a two-dimensional map in which rows are assigned "object nodes", columns are assigned "connected nodes" connected to the object nodes, and the contents of the array are "connected trees" is automatically formed so that the connection relationship between the nodes reflects the circuit configuration. Also, a node array N (object nodes, counts) using the object nodes as an argument and having connected nodes as contents and a tree array T (objects nodes, counts) using the object nodes as an argument and having connected trees as contents are automatically formed from the two-dimensional map. Each count indicates the number of nodes or trees connected to one object node. FIG. 17 shows the two-dimensional map, the connected node array and the connected tree array relating to the circuit shown in FIG. 16.

Figure 18:
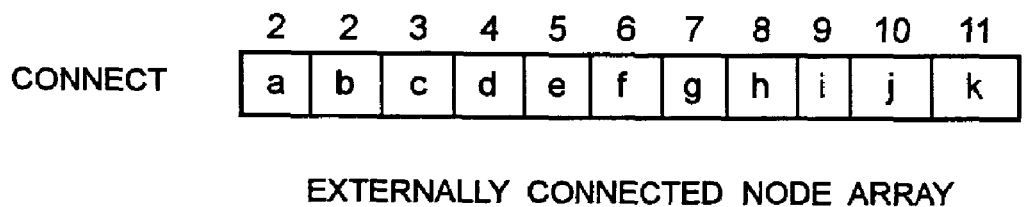
FIG. 18 is a diagram showing an externally connected node array.

The nodes to be externally connected in the circuit diagram in FIG. 16 are recognized from connection information and are stored in an externally connected node array CONNECT. Terminals for external connections described below are the input and output terminals and pairs of terminals for the externally mounted capacitors. A total of eleven nodes are externally connected: the node a to which the input voltage VDD is applied, the nodes b and c connected to the two ends of the capacitor 154, the node d through which the 2× boosted voltage is output, the node e connected to the ground point 163, the nodes f and g connected to the two ends of the capacitor 157, the node h through which the 3× boosted voltage is output, the nodes i and j connected to the two ends of the capacitor 160, and the node k through which the −2× boosted voltage is output. FIG. 18 shows the array CONNECT.

Figure 19:
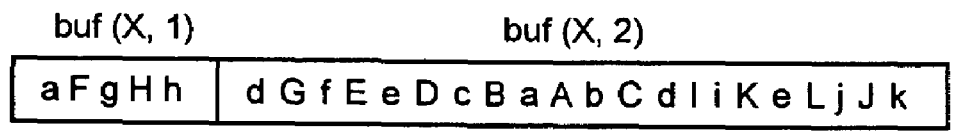
FIG. 19 is a diagram showing an example of data on a "set of routes"

In the automatic connection step (step B), a search is made for a route (written with a single stroke) in which the transistors are successively connected in series through the circuit network. If it is not possible for one route to include all the trees (transistors), some other route is combined to form a "set of routes". A search is made for a "set of routes" having the smallest number of routes constituting it. Data on the xth route (written with a single stroke) is held in a character array buf(x, 1) in the form of node name+tree name+node name+ . . . +tree name+node name. Symbol "+" is not held. In a case where a plurality of routes y cover the circuit network, the xth "set of routes" are represented by a plurality of route data items buf(x, 1), buf(x, 2), . . . , buf(x, y). FIG. 19 shows an example of a set of two routes buf(x, 1), buf(x, 2).

Figure 20:
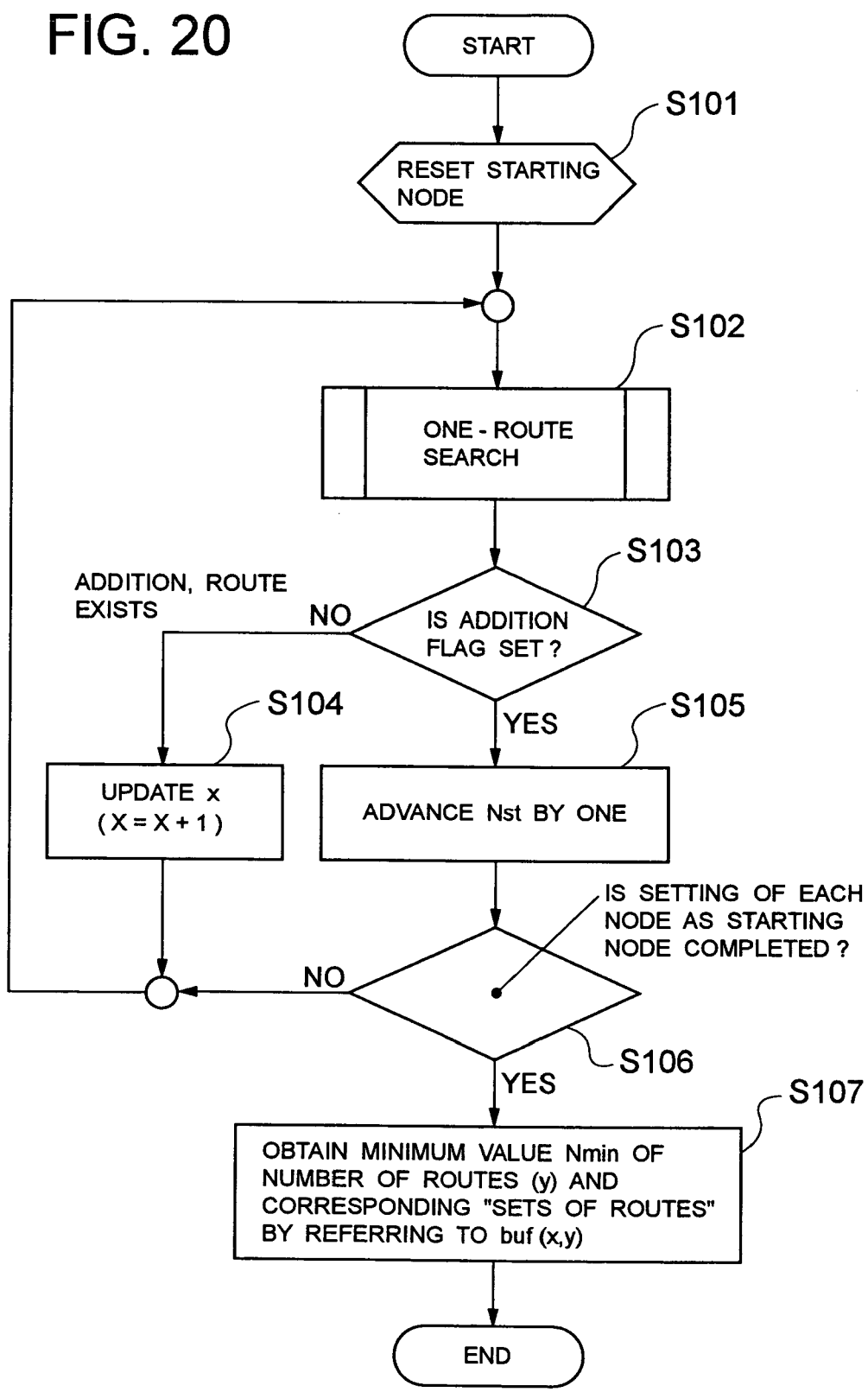
FIG. 20 is a flowchart of automatic connection (all route search)

A route search is made with respect to all the nodes (a, a, c, . . . , k) selected as a starting node Nst. In practice, a "one-route search" subroutine is called in the order of staring node Nst=a, b, c, . . . , k (S102), as shown in the all-route search flowchart of FIG. 20. A plurality of "sets of routes" may exist with respect to one starting node. If a new route is found in the "one-route search" subroutine, an addition flag is set. If the addition flag is set when a one-route search ends, another "one-route search" is made from the same starting node (S105). If the additional flag is not set, there is no new "set of routes" having the present node as a starting node. In this case, the starting node is updated to the next node and other "one-route searches" are successively made (S104).

Figure 21:
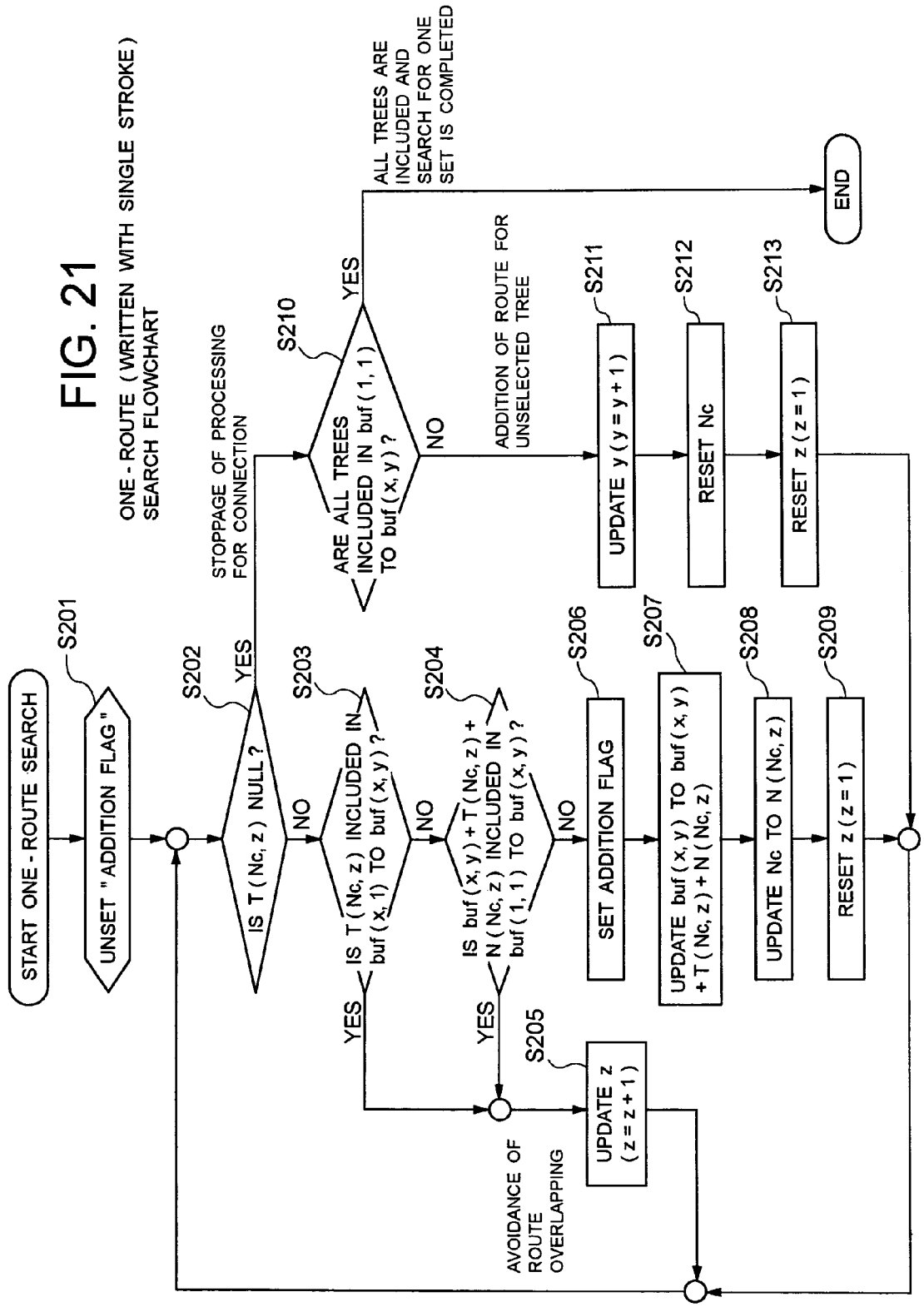
FIG. 21 is a flowchart of a one-route (written with a single stroke) search.

FIG. 21 shows details of the subroutine. In this subroutine, a search is made for one "set of routes" which covers the entire network from the starting node Nst. In actual searching, buf (x, 1) is set to "Nst" and "+T(Nst, 1)+N(Nst, 1)" is concatenated with buf(x, 1) as the tree and the node linked to the starting node Nst by referring to the connected tree array T and the node array N shown in FIG. 17 (S207). The tree and the node linked to the last node "N(Nst, 1)" in the present route buf(x, 1) is then referred and "+T(N(Nst, 1), 1)+N(N(Nst, 1), 1)" is concatenated with buf (x, 1) (S207). Repetitions of these operations can be described as the tree T(Nc, z) and the node N(Nc, z) linked to the last node Nc in the present route buf(x, y) are concatenated at the end of the present route buf(x, y).

If the tree T(Nc, z) to be concatenated has already been selected in buf(x, y) from the xth route set buf (x, 1) (YES in S203), or if the concatenation result buf(x, y)+T(Nc, z)+N(Nc, z) has already been included in routes buf(1, 1) to buf(x, y) (YES in S204), concatenation processing is skipped in order to avoid overlapping and 1 is added to z to make a search for the next connected tree T(Nc, z+1) (S205). On the other hand, in the case where concatenation processing is performed, an addition flag is set (S206). If it becomes impossible to advance the route search, that is, the tree T(Nc, z) linked to the final node Nc has already been selected and T(Nc, z) is null (YES in S202), the route buf(x, y) is terminated.

If all the trees (A, B, . . . , L) are included in the xth "set of routes" buf(x, 1), . . . buf(x, y) presently obtained, that is, when the selection of all the trees constituting the circuit in this "set of routes" is completed (YES in S210), this set of routes is completed. If some of the necessary trees are not yet selected (NO in S210), a new route buf(x, y+1) is added to this set of routes (S211 to S213). The re-search is made not from the starting node Nst but from the first node a in the sequence.

At the stage where the automatic wiring step (step B) is completed, the minimum number Nmin of routes in a set and a plurality of "sets of routes" having the minimum number of routes are obtained (S107). At this stage, the entire circuit width (layout width) is determined. Computation of the circuit width may be executed at this stage or at a later time. Description has already been made of the method of computation of the circuit width and will not be repeated below.

In the subsequent automatic placement and mutual connection step (step C), mutual connections are made such that each of the "sets of routes" having the minimum number of routes forms the desired circuit configuration and a search is made for the combination having the minimum of the total mutual connection wiring length.

Figure 23:
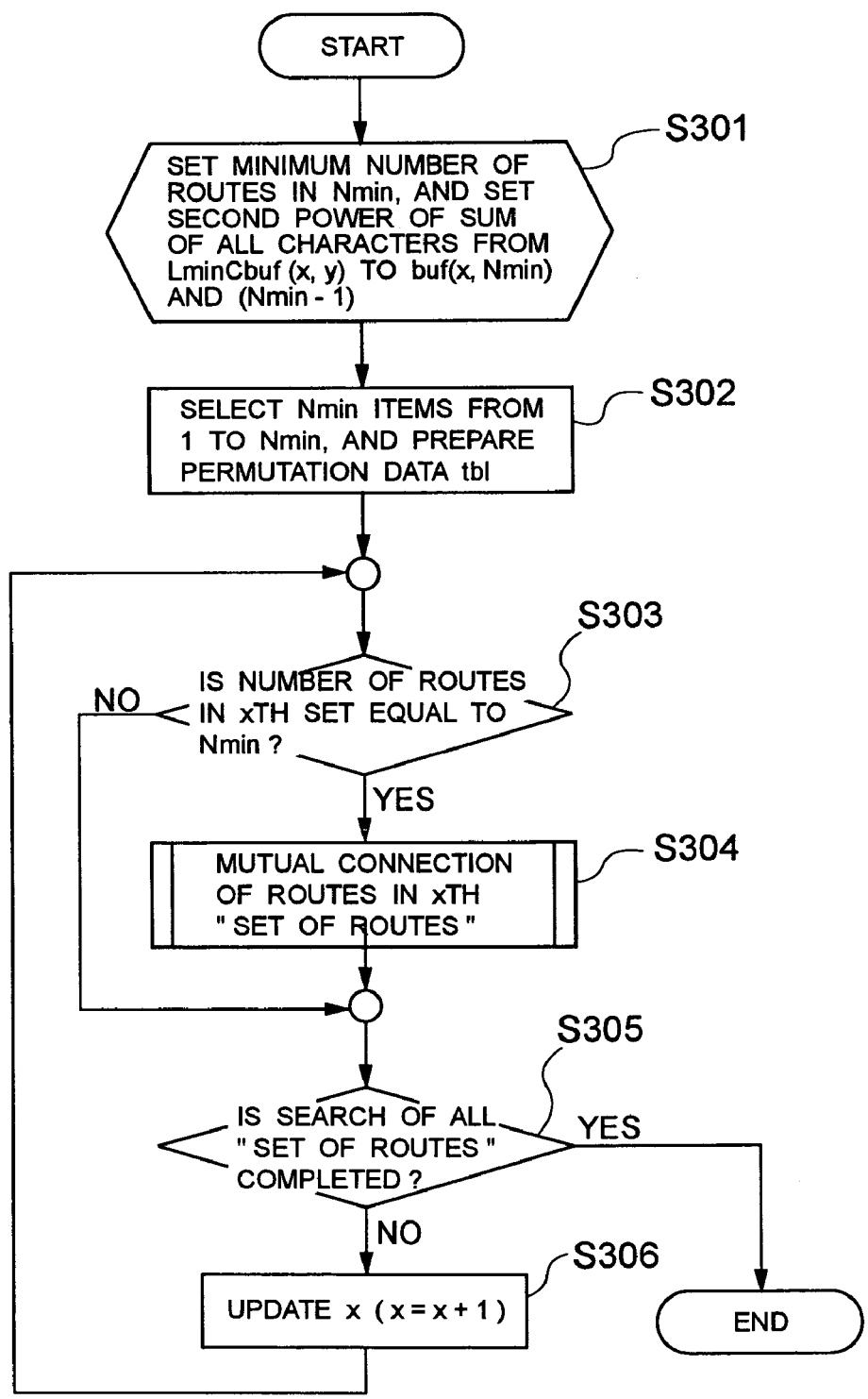
FIG. 23 is a flowchart of mutual connection.

FIG. 23 shows a mutual connection flowchart. The minimum number of routes is substituted for the variable Nmin, and a value obtained as the second power of the sum of the total number of characters from buf(X,1) to buf(X, Nmin) and (Nmin−1) is substituted as an initial value for the minimum Lmin of the total mutual connection wiring length (S301). Also, permutations of Nmin number of elements from integers 1, 2, . . . , Nmin are stored in an array tb1 (S302). The number of rows in the array tb1 corresponds to Nmin! number of the permutations, and the number of columns in the array tb1 corresponds to Nmin number of integers taken out. FIG. 22 shows an example of the array tb1 in a case where Nmin=2 and another example in case where Nmin=3. All the "sets of routes" are searched for the Xth "set of routes" buf(X, 1) to buf(X, Nmin) having the number of routes equal to Nmin, and the process enters a subroutine (S303, S304).

Figure 24:
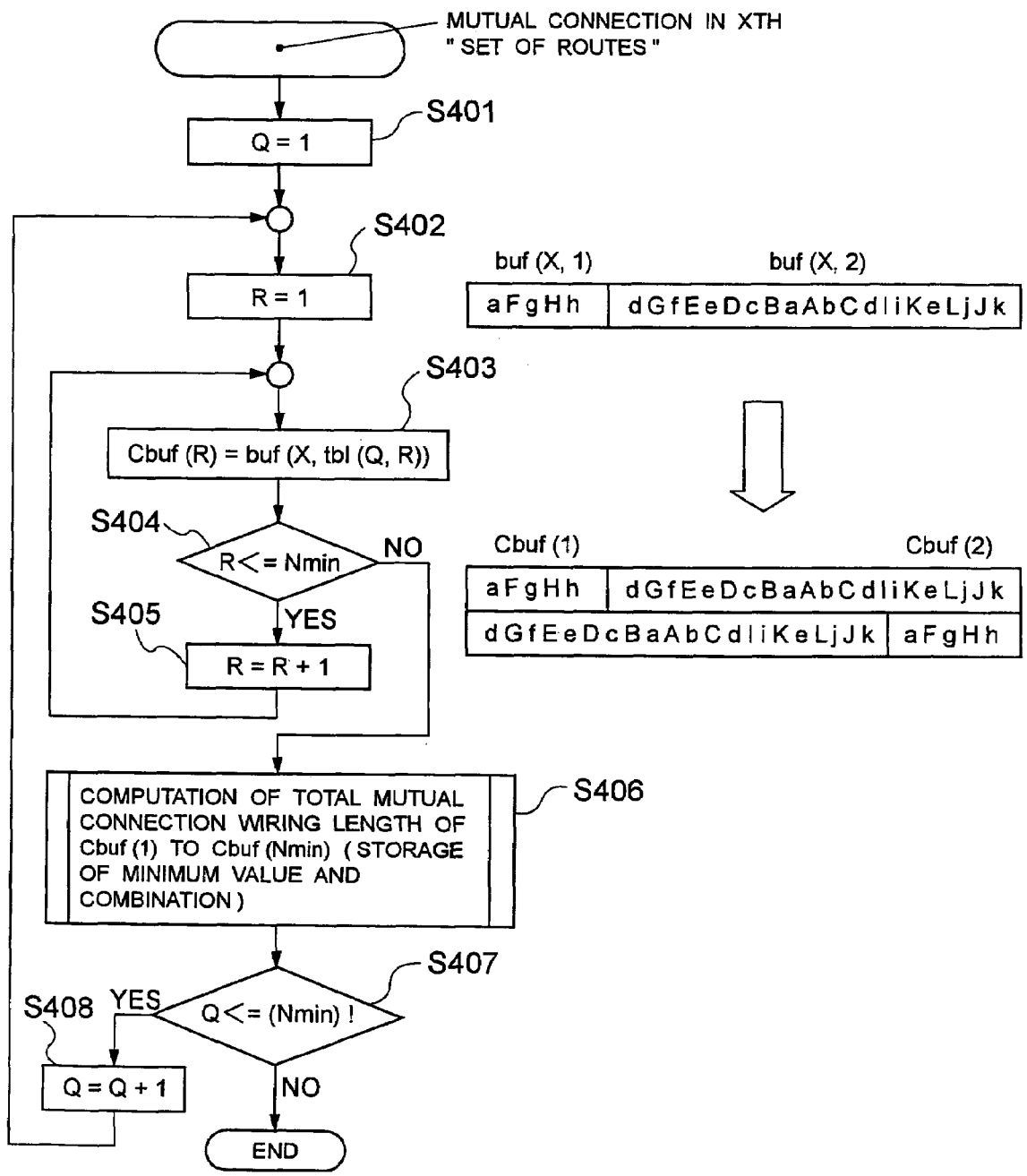
FIG. 24 is a flowchart of mutual connection of the xth set of routes.

FIG. 24 is a detailed mutual connection flowchart with respect to the Xth "set of routes" in step 304. Referring to this flowchart, mutual connections are made with respect to the Xth "set of routes" having the minimum number of routes, i.e., buf(X, 1), buf(X, 2), . . . , buf(X, Nmin) while changing the order in which the routes are placed (S401 to S406). The permutation of the above-described Nmin number of routes to be placed is made in Nmin! ways, and arbitrary permutations Cbuf(1), Cbuf(2), . . . , Cbuf (Nmin) are made by referring to the permutation data tb1 prepared in advance. FIG. 24 shows buf (X, 1), buf(X, 2), Cbuf(1), and Cbuf(2) in the case where Nmin=2. In the flowchart, a loop variable Q is used for repetition of Nmin! and R is used for storage of buf(X) in Nmin number of instances of Cbuf.

Figure 25:
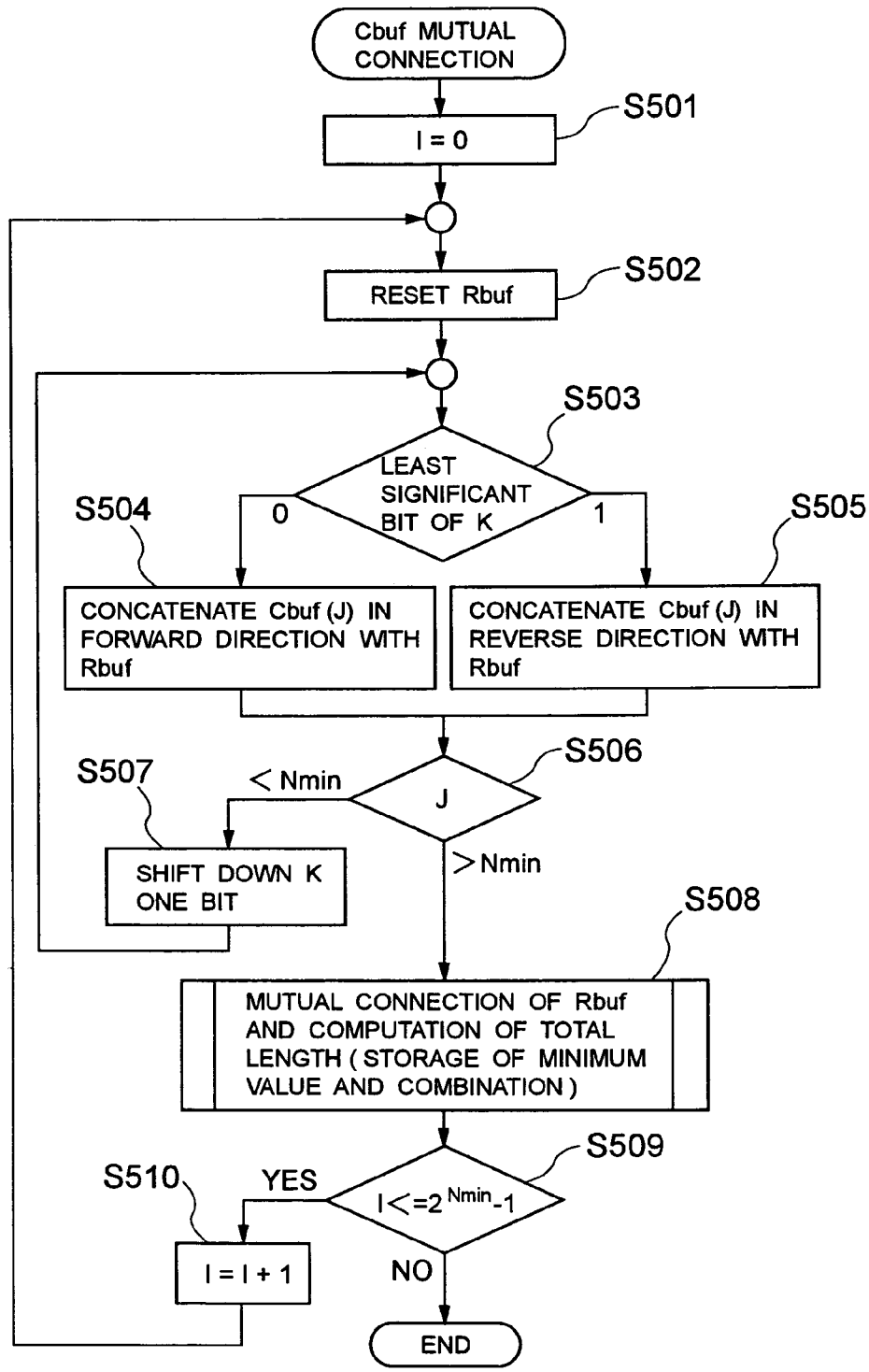
FIG. 25 is a flowchart of Cbuf mutual connection.

FIG. 25 shows details of processing in step S406. In the flowchart shown in FIG. 25, the "sets of routes" Cbuf(1), Cbuf(2), . . . , Cbuf(Nmin) given by the preceding step are concatenated with one data item Rbuf. In concatenation of Cbuf(1), Cbuf(2), . . . , Cbuf(Nmin), a case where each route Cbuf(J) is set in the forward direction and a case where each route Cbuf(J) is set in the reverse direction are possible and there are the number of combinations of the routes corresponding to the Nmin-th power of 2 if all the Nmin number of routes are considered. A loop variable I is used for repetitions of the Nmin-th power of 2, J is used to generate Rbuf by concatenating Nmin number of instances of Cbuf, and an integer variable K is used by being linked to J to generate each route in the forward or reverse direction. FIG. 26 shows an example of Rbuf with which Cbuf(1) and Cbuf(2) are concatenated in the case where Nmin=2. A symbol "/" is inserted as a concatenator between the routes.

Figure 27:
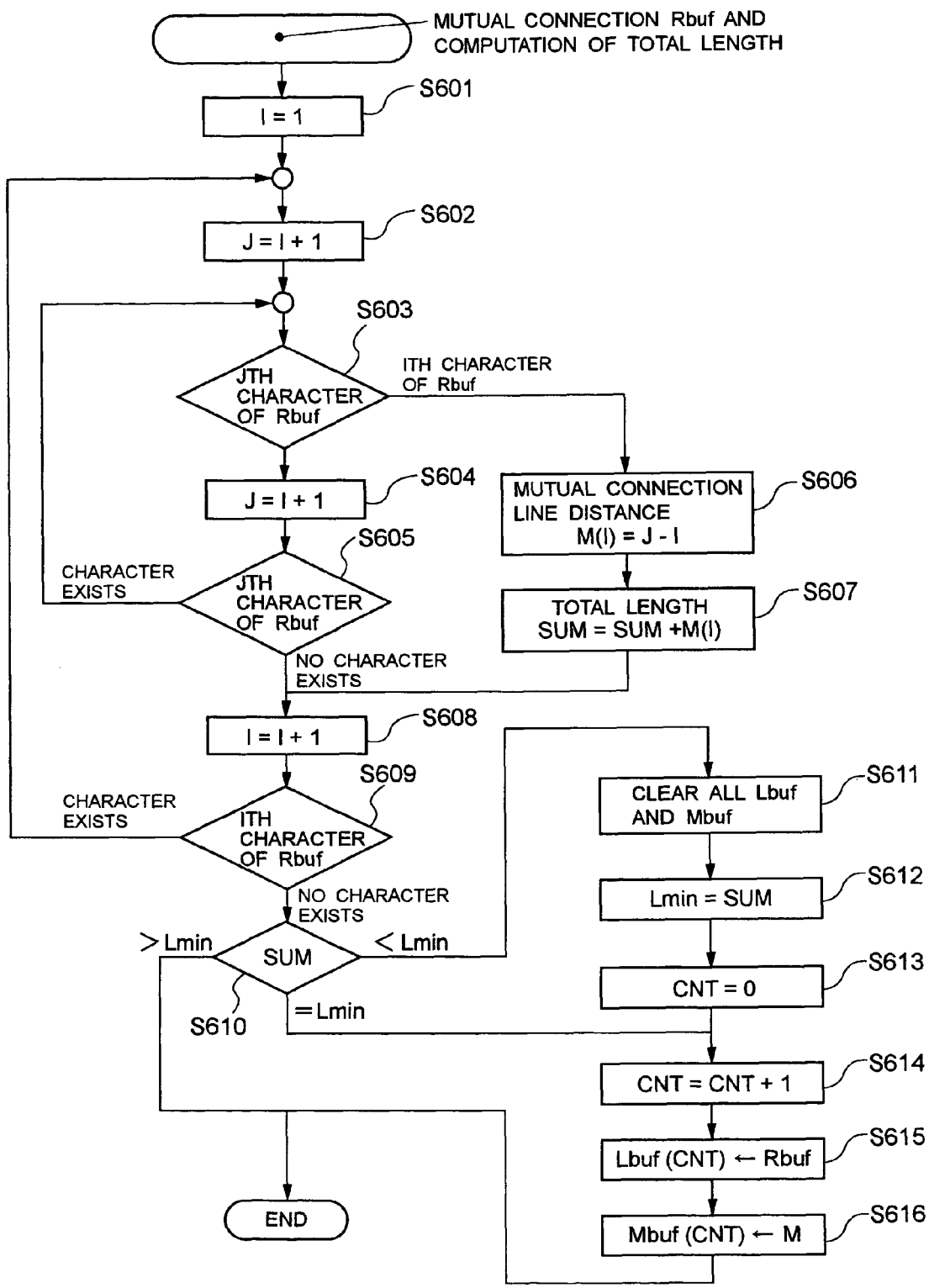
FIG. 27 is a flowchart of mutual connection and total length computation for Rbuf.

FIG. 27 shows details of processing instep S508. Referring to the flowchart of FIG. 27, mutual connections are made between the concatenated routes Rbuf and the total mutual connection wiring length is computed (S601 to S609). Loop variables I and J are used for repetitions of Rbuf corresponding to the number of characters of Rbuf. A search for each mutual connection is made in such a manner that the same character as the Ith character of Rbuf is searched for from the (I+1)th character and, if the Jth character is found as the same character, a wiring distance (J−I) is substituted as mutual connection data in a one-dimensional array M(I). This processing is repeated with respect to all the characters of Rbuf. Connection data for forming the desired circuit is thereby accumulated in the array M. The contents of the array M are added together to obtain the total mutual connection wiring length SUM. FIG. 28 shows an example of mutual connection data M and the total mutual connection wiring length SUM with respect to the eight instances of Rbuf shown in FIG. 26.

In the next step, determination is made as to whether the total mutual connection wiring length SUM of each instance of Rbuf is the smallest (S610). Before description of this determination, the result to be finally obtained will be described. The final result is expressed by the minimum mutual connection wiring length Lmin and corresponding routes Lbuf and mutual connections Mbuf. A two-dimensional array is used for storing a plurality of route data items for Lbuf and Mbuf. The Ith route Lbuf (I) is an array expressed in the form of "node+tree+node+ . . . +node+/+ node+tree+node+ . . . +node+tree+node" including all the nodes constituting the circuit. This array represents the placement of the source, drain and gate electrodes of each transistor. The mutual connection data for the Jth node is stored in mutual connection data Mbuf (I, J) with respect to the Ith route. That is, it is shown that the Jth node is connected by a mutual connection to the (J+Mbuf (I, J)th node.

The steps of comparing the total mutual connection wiring length SUM and the minimum mutual connecting wiring length Lmin (S610 to 616) will be described. A case where SUM is not larger than Lmin means that another route having a shorter mutual connection wiring length exists. If such a value exists, all the least-connection routes Lbuf previously accumulated are invalid and, therefore, Lbuf and Mbuf are all cleared. Then, the current total SUM is set as Lmin and the current route Rbuf and mutual connection data M are respectively substituted for the least-connection route Lbuf(1) and mutual connection data Mbuf(1).

A case where SUM is equal to Lmin means that the current route Rbuf has the same mutual connection wiring length as the previous lead-connection route Lbuf. In this case, therefore, Rbuf and M are added as a different route to Lbuf and Mbuf.

Finally, CNT number of routes Lbuf and mutual connection data Mbuf items such that the total of mutual connection wiring lengths is smallest at Lmin are obtained through all the combinations.

Figure 29:
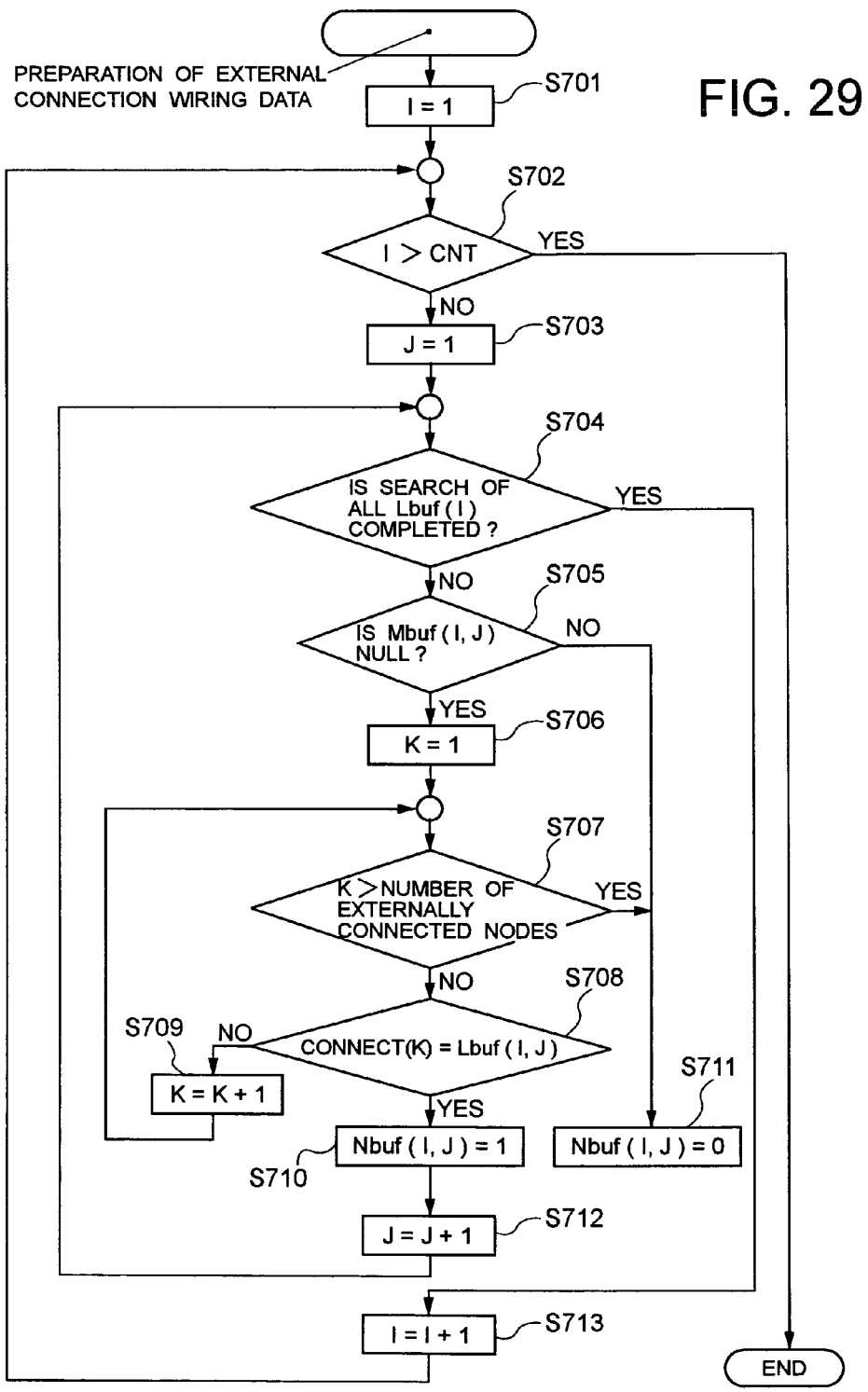
FIG. 29 is a flowchart of formation of external connection line data.

FIG. 29 shows details of the step for connection to external terminals (step D). Referring to the flowchart of FIG. 29, external connection data Nbuf is obtained from routes Lbuf, mutual connection data Mbuf and the externally connected node array shown in FIG. 18. A variable I is used for repetition from 1 to CNT, J is used for repetition from 1 to the route length, and K is used for repetition from 1 to the number of externally connected nodes. External connection data Nbuf is a two-dimensional array. If the Jth character node of the Ith route Lbuf is an externally connected node, Nbuf(I, J) is set to 1 (true). If the Jth character node of the Ith route Lbuf is not an externally connected node, Nbuf(I, J)=0 (false) (S710, S177). Before checking the Ith route Lbuf(I) from the top character with external connection data CONNECT, there is a need to avoid overlapping of nodes connected to each other to have a common potential. A determination can be made by referring to Mbuf as to whether the Ith route Jth character Lbuf(I, J) is a node in a mutual connection. If Mbuf is null, Lbuf(I, J) is not a node in a mutual connection. In this case, checking with CONNECT is thereafter started. If Mbuf is not null, Lbuf (I, J) is a node in a mutual connection and a common-potential node appears subsequently. In this case, therefore, Nbuf (I, J) is set to 0. In checking with CONNECT, Nbuf (I, J) is 1 if Lbuf(I, J) is equal to CONNECT (K) during recurrence of K from 1 through the number of externally connected nodes. Lbuf (I, J) includes tree names other than node names and concatenator "/". However, no match occurs between these items and CONNECT (K). Therefore these items are skipped. The above-described steps are repeated from 1 to CNT to obtain external connection data Nbuf corresponding to the route Lbuf.

Figure 31:
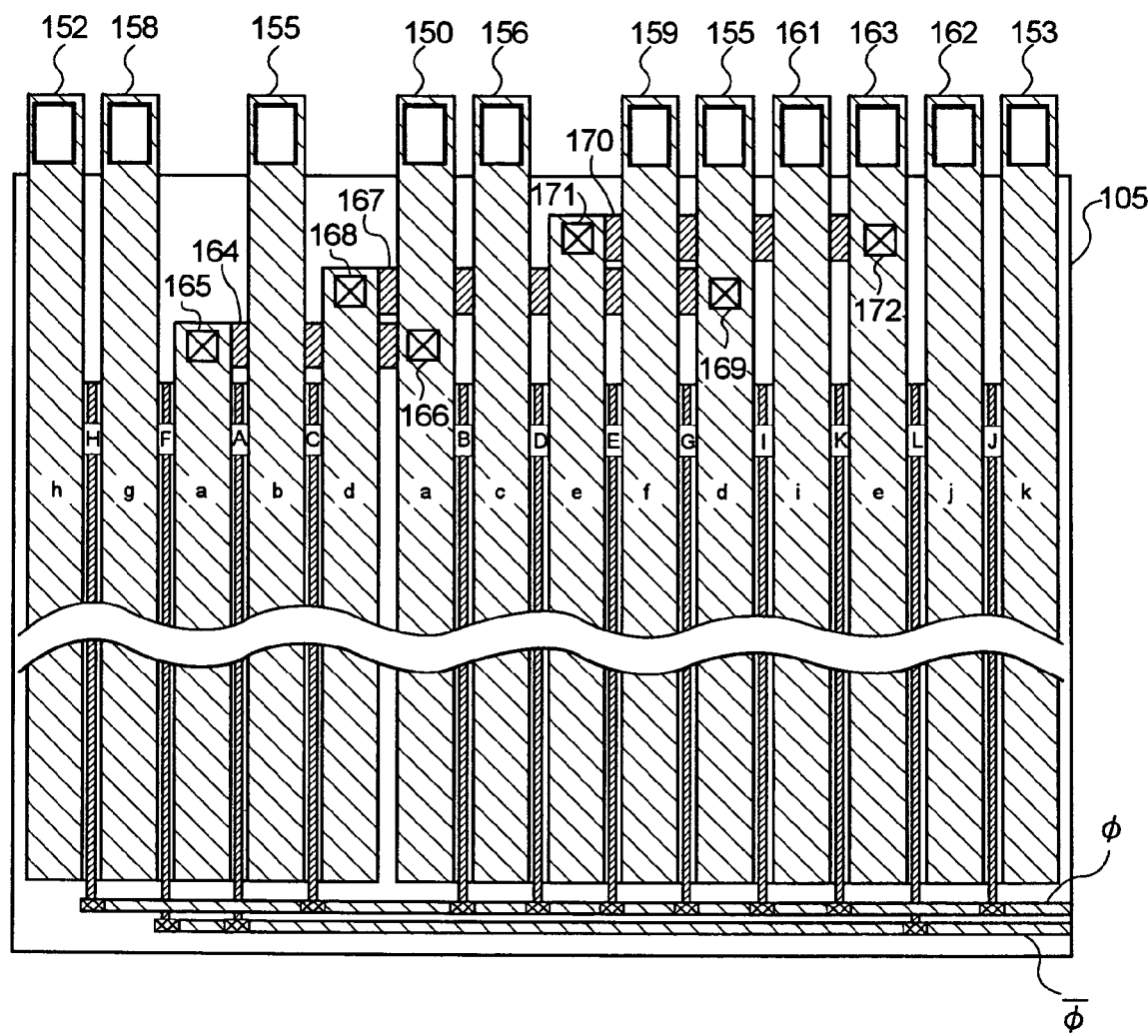
FIG. 31 is a diagram showing an example of automatic layout.
Figure 32:
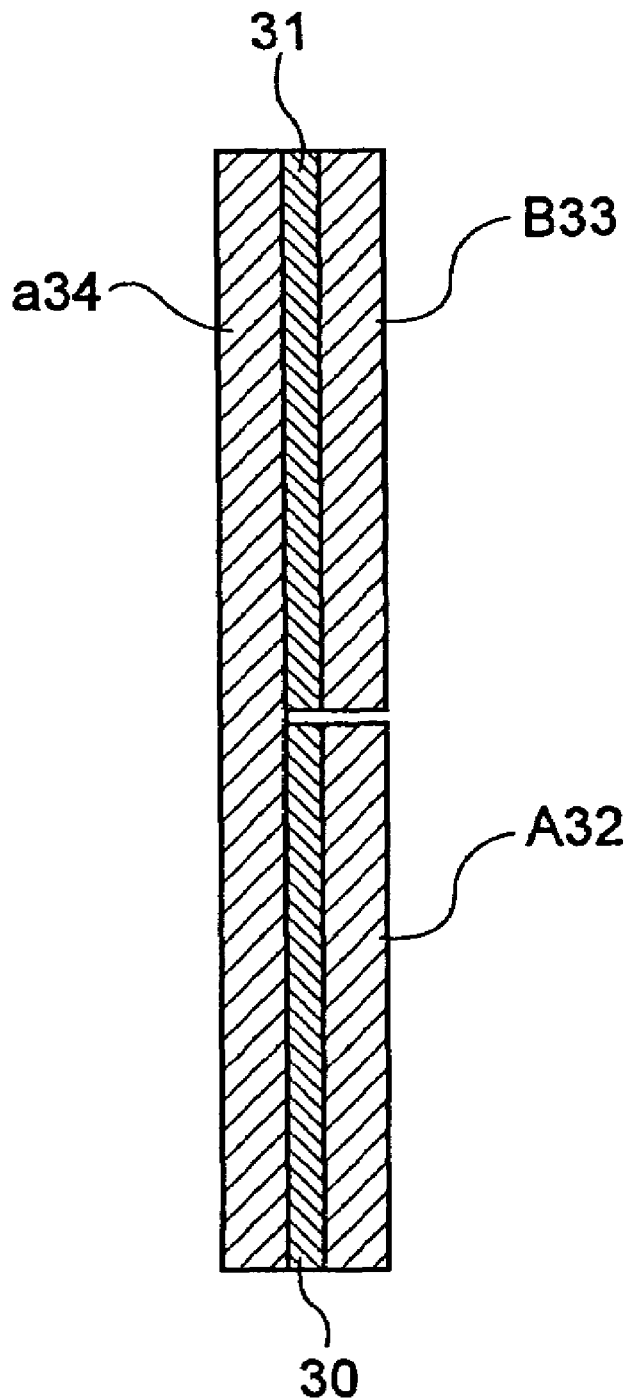
FIG. 32 is a diagram showing an example of an ordinary layout.
Figure 33:
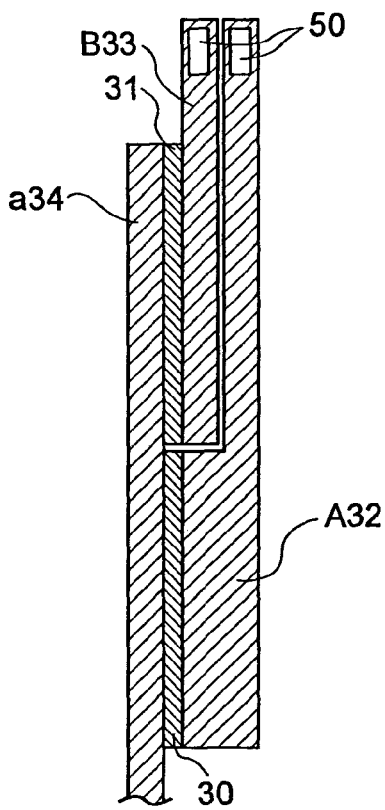
FIG. 33 is a diagram showing an example of an ordinary layout.

Processing in accordance with the above-described automatic layout formation algorithm was performed on the circuit shown in FIG. 16 to obtain Nmin=2 and Lmin=24, as shown in FIG. 30. FIG. 31 shows a circuit layout in a case where placement according to Lbuf(1), mutual connection according to Mbuf(1) and external connection according to Nbuf(1) are performed. Placement of the source, drain and gate electrodes is performed in such a manner that the first layer metal electrode and the gate electrode are alternately placed in the order of h, H, g, F, a, A, b, C, d in the first route, and the minimum spacing in accordance with a mask rule is provided in correspondence of the concatenator "/" indicating the spacing between the first metal electrodes. Subsequently, the first layer metal electrode and the gate electrode are alternately placed in the order of a, B, c, . . . , J, k in the second route.

Mutual connections are successively made with respect to Mbuf(1, 5), Mbuf(1, 9) and Mbuf(1, 15) which are not null in Mbuf(1). First, the electrode a corresponding to the fifth character in Lbuf(1) and the electrode a corresponding to the (5+Mbuf(1, 5))th character, i.e., the eleventh character, in Lbuf(1) are extended by the distance equal to or larger than the width of one mutual connection conductor on the external connection terminal side and are connected to a mutual connection conductor 164 formed by the gate layer through contacts 165 and 166. Next, the electrode d corresponding to the ninth character in Lbuf(1) and the electrode d corresponding to the (9+Mbuf (1, 9))th character, i.e., the nineteenth character, in Lbuf(1) are extended by the distance equal to or larger than the width of two mutual connection conductors on the external connection terminal side and are connected to a mutual connection conductor 167 formed by the gate layer through contacts 168 and 169. Finally, the electrode e corresponding to the fifteenth character in Lbuf (1) and the electrode e corresponding to the (15+Mbuf(1, 15))th character, i.e., the twenty-third character, in Lbuf(1) are extended by the distance equal to or larger than the width of three mutual connection conductors on the external connection terminal side and are connected to a mutual connection conductor 170 formed by the gate layer through contacts 171 and 172.

Finally, electrodes Nbuf(1, X) corresponding to 1 in the contents from Nbuf(1, 1) to Nbuf(1, 27) are extended to be connected to external terminals in wiring layout for a clock to be applied to the gate voltage, thus completing the automatic layout process.

In the semiconductor integrated circuit in the first aspect of the present invention, transistors are placed in the gaps between a plurality of power supply lines, thereby forming a circuit in which the overall width of the circuit can be reduced even in terms of the total of the widths of all the power supply lines and the widths of the transistors and which can be placed in a small-width area.

In the semiconductor integrated circuit in the second aspect of the present invention, it is not necessary to increase the circuit width when the electrodes of transistors are wired to external connection terminals, so that a small-width circuit can be formed.

In the semiconductor integrated circuit in the third aspect of the present invention, even if the circuit configuration is complicated, unconnected power supply lines are connected to limit an increase in complexity of the layout without increasing the circuit width.

In the semiconductor integrated circuit in the fourth aspect of the present invention, the layout area of power supply lines is increased relative to that of all transistors to limit a voltage drop or an increase in power consumption in the power supply lines.

In the semiconductor integrated circuit in the fifth aspect of the present invention, gate signal wiring having low-resistance and low-capacity characteristics in comparison with gate electrodes is provided to reduce the delay time of a gate signal even in transistors placed in a small-width region.

In the semiconductor integrated circuit in the sixth aspect of the present invention, a small-width thin-film transistor circuit can be placed on the periphery of a display screen or a sending region of a display or a sensor to enable the display screen or the sensing region to be increased.

In the method of manufacturing a semiconductor integrated circuit in the seventh aspect of the present invention, transistors arranged in a row can be simultaneously crystallized in a crystallization step in manufacturing of thin-film transistors to reduce performance variations between the transistors.

In the charge pump circuit in the eighth aspect of the present invention, a small-width power supply circuit can be placed on the periphery of a display screen of a sensing region or a sensor to increase the display screen or the sensing region while simplifying the input interface.

The layout designing apparatus in the ninth or tenth aspect of the present invention can automatically form a layout capable of placing a circuit constituted by a plurality of transistors in a small-width region.

The layout designing apparatus in the eleventh aspect of the present invention can automatically form a layout capable of placement in a region of a smaller width in comparison with a layout method in which gate electrodes are uniformly spaced apart from each other and which is ordinarily used in the case of placing a plurality of transistors uniformly spaced apart from each other.

The layout designing apparatus in the twelfth aspect of the present invention does not always ensure that a layout capable of placement in a small area can be obtained, but simplifies the processing for layout designing of a semiconductor integrated circuit capable of being placed in a small-width region.

The layout designing apparatus in the thirteenth aspect of the present invention can automatically form a layout capable of placing a circuit constituted by a plurality of transistors in a small area in a small-width region.

The layout designing apparatus in the fourteenth aspect of the present invention can limit an increase in complexity of the layout and an increase in the number of external terminals even if the desired circuit is complicated.

The layout designing apparatus in the fifteenth aspect of the present invention enables automatic layout of a semiconductor integrated circuit such that even in a case where external input/output terminals are concentrated on one side so that the degree of design freedom is low, the circuit can be connected to the external input/output terminals without increasing the layout width.

The semiconductor integrated circuit in the sixteenth or seventeenth aspect of the present invention is capable of placing a circuit constituted by a plurality of transistors in a small-width region.

The semiconductor integrated circuit in the eighteenth aspect of the present invention is capable of placement of circuit elements in a region of a smaller width in comparison with an ordinary semiconductor integrated circuit in which gate electrodes are uniformly spaced apart from each other.

The semiconductor integrated circuit in the nineteenth aspect of the present invention is capable of simplified layout designing, although placement of circuit elements in a small area cannot always be ensured.

The semiconductor integrated circuit in the twentieth aspect of the present invention is capable of placing a circuit constituted by a plurality of transistors in a small area in a small-width region.

The semiconductor integrated circuit in the twenty-first aspect of the present invention is capable of limiting an increase in layout complexity and an increase in the number of external terminals even if the desired circuit is complicated.

The semiconductor integrated circuit in the twenty-second aspect of the present invention is capable of being connected to external input/output terminals without increasing the layout width even if the external input/output terminals are concentrated on one side so that the degree of design freedom is low.

What is claimed is:

1. A layout of a semiconductor integrated circuit, comprising:
    at least four separate power supply lines; and
    at least two transistors for switching between said at least four power supply lines,
    wherein first, second and third power supply lines of said at least four power supply lines are arranged side-by-side in that order,
    wherein said at least two transistors include first and second transistors respectively placed in a gap between said first and second power supply lines and a gap between said second and third power supply lines, said first and second transistors being formed on opposite sides of said second power supply line,
    wherein at least one of said at least four power supply lines extends straight to an external connection terminal and is connected to said external connection terminal.

2. A layout of a semiconductor integrated circuit comprising:
    at least four separate power supply lines; and
    at least two transistors for switching between said at least four power supply lines,
    wherein first, second and third power supply lines of said at least four power supply lines are arranged side-by-side in that order,
    wherein said at least two transistors include first and second transistors respectively placed in a gap between said first and second power supply lines and a gap between said second and third power supply lines, said first and second transistors being formed on opposite sides of said second power supply line,
    wherein said first and second transistors are thin-film transistors on an insulation substrate other than a glass substrate or a semi-conductor substrate, and wherein said first transistor switches between said first and second powers supply lines and said second transistor switches between said second and third powers supply lines.

3. The layout of the semiconductor integrated circuit according to claim 2, wherein at least one of said power supply lines extends to be connected to an external connection terminal.

4. The layout of the semiconductor integrated circuit according to claim 2, further comprising a mutual connection line for connecting together some of said power supply lines having equal potentials, wherein the mutual connection line is not connected to any of said power supply lines other than those having equal potentials.

5. The layout of the semiconductor integrated circuit according to claim 2, wherein the area occupied by all of said power supply lines is larger than the area occupied by all of the regions between said power supply lines.

6. The layout of the semiconductor integrated circuit according to claim 2, further comprising a gate signal wiring line in order to avoid a delay of a gate signal propagating through the corresponding one of the gate electrodes of said transistors, the gate signal wiring line having a resistance and a parasitic capacitance lower than those of the gate electrode.

7. A charge pump circuit comprising the semiconductor integrated circuit according to claim 2, and a configuration of a plurality of capacitors and a plurality of transistors.

* * * * *